(12) United States Patent
Wang

(10) Patent No.: US 7,605,007 B2
(45) Date of Patent: Oct. 20, 2009

(54) SEMICONDUCTOR DEVICE AND METHOD OF MANUFACTURING THE SAME

(75) Inventor: Wensheng Wang, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 71 days.

(21) Appl. No.: 12/040,393

(22) Filed: Feb. 29, 2008

(65) Prior Publication Data

US 2008/0217738 A1   Sep. 11, 2008

(30) Foreign Application Priority Data

Mar. 9, 2007   (JP) .............................. 2007-060473

(51) Int. Cl.
*H01L 21/00*   (2006.01)
*H01L 21/20*   (2006.01)
*H01L 29/76*   (2006.01)
*H01L 29/00*   (2006.01)

(52) U.S. Cl. ........................... 438/3; 438/399; 257/295; 257/535; 257/E27.048

(58) Field of Classification Search .................... 438/3, 438/399; 257/295, 535, E27.048
See application file for complete search history.

(56) References Cited

U.S. PATENT DOCUMENTS

| 6,146,906 | A | 11/2000 | Inoue et al. |
| 6,531,726 | B1 | 3/2003 | Takamatsu |
| 6,624,458 | B2 | 9/2003 | Takamatsu et al. |
| 6,713,808 | B2 * | 3/2004 | Wang et al. ................. 257/310 |
| 6,740,533 | B2 | 5/2004 | Takamatsu et al. |
| 6,825,515 | B2 | 11/2004 | Takamatsu |
| 6,887,716 | B2 | 5/2005 | Fox et al. |
| 7,078,242 | B2 | 7/2006 | Matsuura et al. |
| 2002/0074601 | A1 | 6/2002 | Fox et al. |
| 2002/0185668 | A1 | 12/2002 | Takamatsu et al. |
| 2003/0122176 | A1 | 7/2003 | Takamatsu |
| 2003/0213986 | A1 | 11/2003 | Takamatsu et al. |
| 2005/0136556 | A1 | 6/2005 | Matsuura et al. |
| 2006/0043445 | A1 | 3/2006 | Wang |
| 2006/0175642 | A1 | 8/2006 | Dote et al. |

FOREIGN PATENT DOCUMENTS

| EP | 1 115 148 A1 * | 7/2001 |
| JP | 2000-058525 A * | 2/2000 |
| JP | 2000-091270 A * | 3/2000 |
| JP | 3109485 B2 * | 9/2000 |
| JP | 2001-127262 A * | 5/2001 |
| JP | 2002-246564 A * | 8/2002 |
| JP | 2004-273787 A | 9/2004 |
| JP | 3661850 B2 * | 4/2005 |
| JP | 2005-183842 A * | 7/2005 |
| JP | 2006-073648 A * | 3/2006 |
| JP | 2006-128274 A * | 5/2006 |
| JP | 2006-222227 A * | 8/2006 |

* cited by examiner

*Primary Examiner*—David S Blum
(74) *Attorney, Agent, or Firm*—Westerman, Hattori, Daniels & Adrian, LLP.

(57) ABSTRACT

An upper electrode film includes a first conductive oxidation layer made of an oxide expressed by a chemical formula $M_1O_{x2}$, a second conductive oxidation layer made of an oxide expressed by a chemical formula $M_2O_{y2}$ and a third conductive oxidation layer. Here, the second conductive oxidation layer is formed to have a degree of oxidation higher than the first conductive oxidation layer and the third conductive oxidation layer, and among the composition parameters $x_1$, $x_2$, $y_1$, $y_2$, $z_1$ and $z_2$, there are the following relations, $y_2/y_1 > x_2/x_1$, $y_2/y_1 > z_2/z_1$, and $z_2/z_1 \geq x_2/x_1$.

20 Claims, 17 Drawing Sheets

OXYGEN VACANCY

_US 7,605,007 B2_

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2007-060473, filed on Mar. 9, 2007, the entire contents of which are incorporated herein by reference.

TECHNICAL FIELD

The present invention relates to a semiconductor device having a capacitor structure and a method of manufacturing the semiconductor device.

BACKGROUND

In recent years, in accordance with the progress in digital technology, there has been a growing tendency to process or store a massive amount of data at a high speed. As a result, high integration and sophistication in the performance of semiconductor devices used in electric equipment are required.

Accordingly, as for a semiconductor memory device, for instance, in order to realize high integration of DRAM, a technology using a ferroelectric material or a high permittivity material as a capacitor insulating film for the capacitor which composes the DRAM, instead of conventional silicon oxide or silicon nitride, starts to be widely researched and developed.

In addition, in order to materialize non-volatile RAM, which makes it possible to operate writing and reading at a voltage as low as possible and at a high speed, a technology using a ferroelectric having spontaneous polarization characteristics for the capacitor insulating film is also actively being researched and developed. Such a semiconductor memory device is called a ferroelectric random access memory (FeRAM).

The ferroelectric random access memory is provided with a ferroelectric capacitor, in which a ferroelectric film serving as a capacitor insulating film is sandwiched between a pair of electrodes. The ferroelectric random access memory stores information using the hysteresis characteristics of the ferroelectric film.

The ferroelectric film brings forth polarization according to the voltage applied between electrodes and holds spontaneous polarization characteristics even when the applied voltage is taken away. In addition, when the polarity of the applied voltage is reversed, the polarity of the spontaneous polarization of the ferroelectric film reverses. Accordingly, if the spontaneous polarization is detected, information can be read out. The ferroelectric random access memory works at a voltage lower than a flash memory, which makes it possible to write with a reduced power and at a high speed.

The ferroelectric film composing a capacitor of the ferroelectric random access memory (FeRAM) is formed from lead zirconate titanate (PZT), lanthanum (La) doped PZT (PLZT), PZT based material doped with calcium (Ca), strontium (Sr) or silicon (Si) in minute quantities, bismuth (Bi) layer structured compound such as $SrBi_2Ta_2O_9$ (SBT, Y1) or $SrBi_2(Ta, Nb)_2O_9$ (SBTN, YZ) or the like, and deposited by the sol-gel method, the sputtering method, the metal organic chemical vapor deposition (MOCVD) method, or the like.

Generally, an amorphous or microcrystalline ferroelectric film is formed above the lower electrode by these deposition methods, and thereafter, its crystal structure is changed into a perovskite structure, or a bismuth layer structure by heat treatment. It is necessary to use a material which does not oxidize easily or can maintain its conductivity even oxidized as an electrode material in the capacitor structure, and usually platinum series metals or their oxides such as platinum (Pt), Iridium (Ir), iridium oxide (IrOx) and the like are widely used. As for a wiring material, aluminum (Al) is commonly used similarly to the general case of semiconductor devices.

Further higher integration and sophistication in performance are required to the ferroelectric random access memory (FeRAM) as well as other semiconductor devices, and reduction in the cell size will be necessary in future. In order to reduce the cell size, it is known to be an effective means to adopt a stacked structure for the capacitor structure instead of the conventional planar structure. Here, the stacked structure means a structure in which a capacitor is formed directory above a plug (contact plug) formed on the drain of a transistor composing a memory cell.

In a conventional stacked structured ferroelectric random access memory (FeRAM), the capacitor structure includes barrier metal, a lower electrode, a ferroelectric film, and an upper electrode stacked in this order directly above a tungsten (W) plug. The barrier metal has the function of preventing oxidation of the tungsten (W) plug. Since a material having both the effect of the barrier metal and the lower electrode is often selected, it is impossible to distinctly separate the barrier metal and the lower electrode material, the barrier metal and the lower electrode are usually formed by combining two or more kinds of films selected from the groups consisting of a titanium nitride (TiN) film, a titanium aluminum nitride (TiAlN) film, an iridium (Ir) film, an iridium oxide ($IrO_2$) film a platinum (Pt) film, and a $SrRuO_3$ (SRO) film.

The ferroelectric film forming a ferroelectric capacitor structure easily creates oxygen loss by treating in a non-oxidation atmosphere, which results in deterioration in ferroelectric film characteristics such as switching charge or a leak current value. When manufacturing the ferroelectric capacitor, it is necessary for recovery of damage created in the ferroelectric film to conduct heat treatment in an oxygen atmosphere in a plurality of times. Accordingly, as a material for the upper electrode, metals hard to be oxidized in an oxygen atmosphere such as platinum (Pt) or the like, or conductive oxides such as iridium oxide ($IrO_x$), ruthenium oxide ($RuO_x$) or the like are used.

Incidentally, in recent years, an intense requirement for microminiaturization is also imposed on the ferroelectric random access memory (FeRAM), which results in requirement of microminiaturization of the ferroelectric capacitor structure and adoption of a multi-layered wiring structure. Furthermore, operation at a low voltage is required corresponding to the application to a portable type information processor. In order that the ferroelectric random access memory (FeRAM) may operate at a low voltage, the ferroelectric film composing the ferroelectric capacitor structure is required to have a large switching charge QSW, but when the multi-layered wiring structure is adopted, a problem that the already formed characteristics of the ferroelectric capacitor structure are worsened owing to the processing in a reduction atmosphere or in a non-oxidation atmosphere used at the step of forming the multi-layered wiring structure, arises.

Explaining the above more specifically, when the upper electrode is formed from a platinum (Pt) film, an iridium (Ir) film, or the like, hydrogen in a reduction atmosphere used at the time of forming an interlayer insulating film in the multi-layered wiring structure migrates into a platinum (Pt) film or an iridium (Ir) film and is activated by a catalytic function possessed by these metals, which brings about a problem that the ferroelectric film, which is a capacitor film in the ferroelectric capacitor structure, is reduced by the activated hydrogen.

When the capacitor film is reduced, the operational characteristics of the ferroelectric capacitor structure are greatly deteriorated. Such a problem of deterioration in characteristics of the capacitor film appears especially remarkably when the ferroelectric capacitor structure is micronized, and the capacitor film in the ferroelectric capacitor structure is composed of the micronized ferroelectric film.

In order to cope with the problem, patent document 1 (Japanese Patent No. 3661850) makes a suggestion that since microminiaturization can be performed without deterioration of electric characteristic of the ferroelectric capacitor structure in the process of establishing the multi-layered wiring structure, an upper electrode formed on the ferroelectric film is composed of a first conductive oxidation layer and a second conductive oxidation layer, and the second conductive oxidation layer is formed to have a composition stoichiometrically closer than the first conductive oxidation layer.

[Patent Document 1] Japanese Patent No. 3661850

However, the ferroelectric capacitor structure manufactured according to the above-described patent document 1 brings about the following problems.

The second conductive oxidation layer, whose degree of oxidation is higher than that of the first conductive oxidation layer is apt to grow abnormally when the film thickness becomes great. In other words, when the thickness of the crystallized second conductive oxidation layer increases, the growth of the crystal on the surface progresses abnormally. Especially, when depositing at a high temperature, for instance, in the case that the second conductive oxidation layer has a thickness of about 150 nm or more, this abnormal growth becomes remarkable.

There is a problem that hole in film is produced due to the abnormal growth of the crystal in the upper electrode, and hydrogen is apt to migrate into the capacitor film through the upper electrode, which results in deterioration of the capacitor film. Due to the deterioration, the switching characteristics, the initial characteristics, and the retention characteristics of the device are remarkably lowered.

SUMMARY

One aspect of the present invention may be to provide a semiconductor device including a semiconductor substrate, and a capacitor structure formed above the semiconductor substrate and structured by the capacitor film being sandwiched between an upper electrode and a lower electrode, in which the above-described upper electrode includes: a first layer made of an oxide, of which stoichiometric composition is expressed by a chemical formula $M_1O_{x1}$ using a composition parameter $x_1$, and of which practical composition is expressed by a chemical formula $M_1O_{x2}$ using a composition parameter $x_2$, a second layer made of an oxide formed on the above-described first layer, and its stoichiometric composition is expressed by a chemical formula $M_2O_{y1}$ using a composition parameter $y_1$, and its practical composition is expressed by a chemical formula $M_2O_{y2}$ using a composition parameter $y_2$, and a third layer made of an oxide formed on the above-described second layer, and its stoichiometric composition is expressed by a chemical formula $M_3O_{z1}$ using a composition parameter $z_1$, and its practical composition is expressed by a chemical formula $M_3O_{z2}$ using a composition parameter $z_2$ where the symbols $M_1$, $M_2$ and $M_3$ are respectively expressed as one or plural metal elements, in which the above-described second layer is formed to have a degree of oxidation higher than the first layer and the third layer, and among the above-described composition parameters $x_1$, $x_2$, $y_1$, $y_2$, $z_1$ and $z_2$, there are the following relations, $$y_2/y_1 > x_2/x_1,\ y_2/y_1 > z_2/z_1,\ \text{and}\ z_2/z_1 \geq x_2/x_1.$$

Another aspect of the present invention may be to provide a method of manufacturing the semiconductor device having a capacitor structure including: forming a lower electrode having the above-described capacitor structure above a semiconductor substrate, forming a capacitor film above the lower electrode, and forming an upper electrode above the capacitor film by stacking at least a first conductive oxidation layer, a second conductive oxidation layer and a third conductive oxidation layer sequentially, in which forming the first conductive oxidation layer and the third conductive oxidation layer is conducted under the oxidation content lower than that in depositing the second conductive oxidation layer.

DETAILED DESCRIPTION OF THE EMBODIMENTS

As a comparative example of the present invention, in order to suppress abnormal growth of a crystal in the upper electrode of a ferroelectric capacitor manufactured according to the method of manufacturing in Patent Document 1, a second conductive oxidation layer is formed in a two-layered structure composed of an amorphous lower layer and a crystallized upper layer. The method of formation is to consecutively deposit respective layers while, for instance, changing the power flowing into a deposition apparatus (sputtering apparatus or the like).

The amorphous lower layer of the second conductive oxidation layer is crystallized as the substrate temperature rises during deposition. At this time, no abnormal growth is found in the lower layer (refer to FIG. 1). In this case, however, the lower layer is gradually crystallized including the step of forming multi-layered wiring, and when the step of forming the multilayer wiring is completed, holes in film such as oxygen loss and the like are created in the lower layer (refer to FIGS. 2 and 3 by TEM). Due to the existence of the hole in film, hydrogen or the like migrates into the capacitor film during the step of forming the multi-layered wiring, which results in deterioration in electric characteristics. In addition, film peeling is apt to occur on the wiring.

Figure 1:
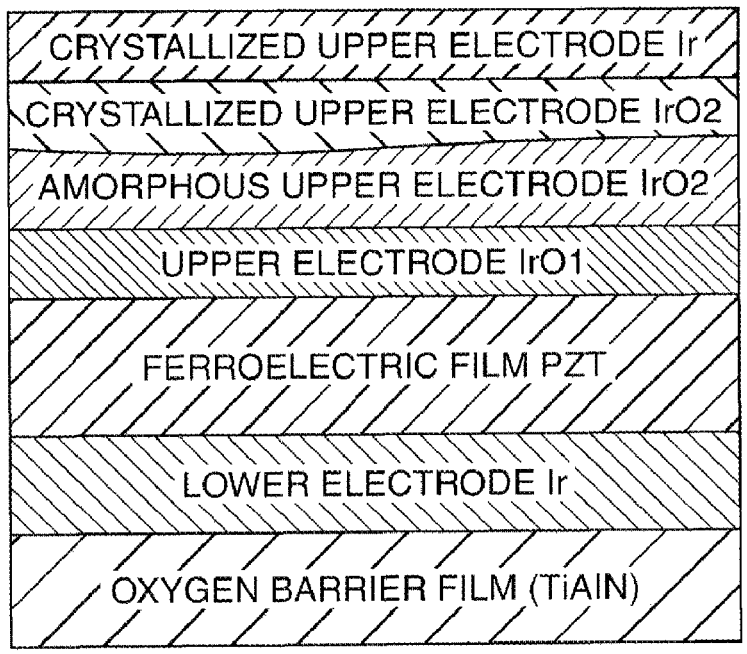
FIG. 1 is a sectional view showing a ferroelectric capacitor of a comparative example of the present invention.
Figure 2:
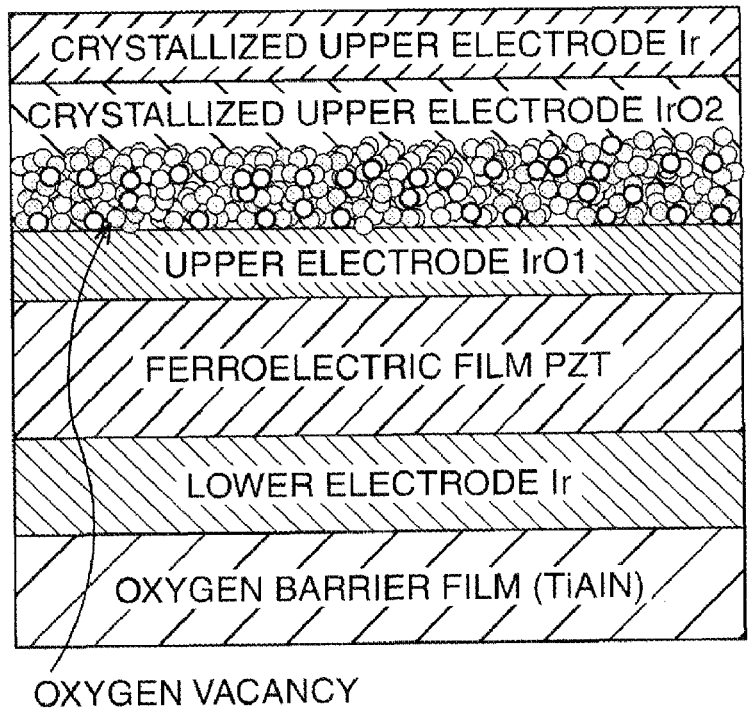
FIG. 2 is a sectional view showing a ferroelectric capacitor of a comparative example of the present invention.
Figure 3:
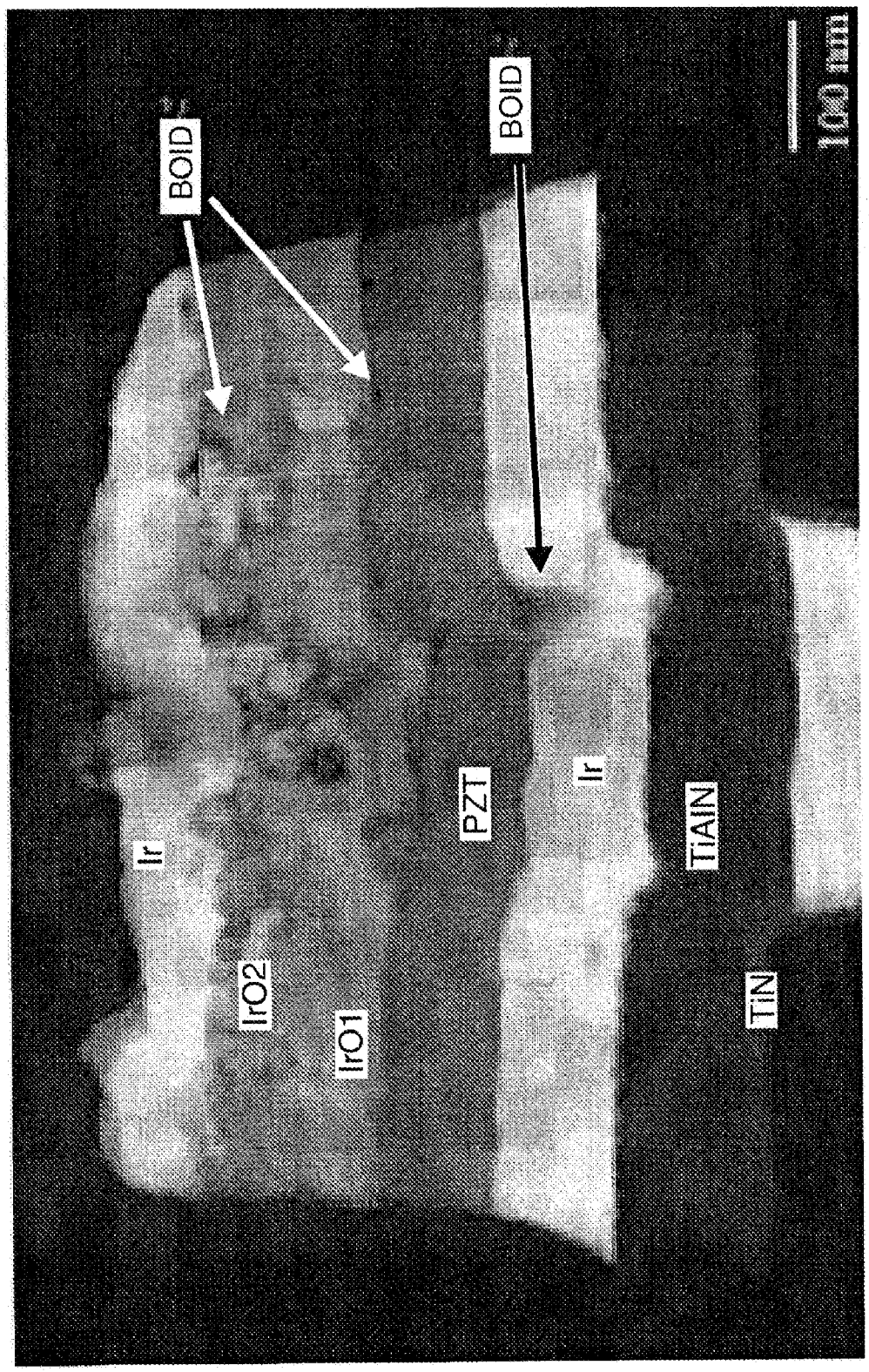
FIG. 3 is a view showing a photograph by TEM of a section of the ferroelectric capacitor of the comparative example of the present invention.

Note that in the respective FIGS. 1 and 2, for the respective layers forming respective upper electrodes, they are designated as an upper electrode IrO1, an (amorphous upper electrode IrO2), an upper electrode IrO2, and a crystallized upper electrode Ir in turn from the bottom for convenience sake.

Furthermore, in the capacitor structure, a tungsten plug is used for the connection between the upper electrode and the wiring on the first layer. When the tungsten plug is formed above the upper electrode, it is necessary to deposit a tungsten film in a reducing atmosphere at a high temperature. Hydrogen generated at the time of deposition is mostly blocked by titanium nitride (TiN), which is the glue film on the tungsten plug. When excessive hydrogen is supplied, however, it passes through the blocking by titanium nitride (TiN) and migrates into the upper electrode, reducing $IrO_x$ in the upper electrode to cause volume shrinkage, which results in the formation of holes between the glue film and the upper electrode. As a result, there is a problem of instability in the contact resistance of the upper electrode.

As a result of earnest studies based on the result of the above-described comparative example, the inventors have come up with the present invention.

In the present invention, the upper electrode is formed in a stacked structure including a first layer, a second layer, and a third layer, in which respective composition parameters have the above-described relation. In the present invention, when depositing the second layer, it is formed in a microcrystalline state by controlling the deposition conditions, more specifically, by controlling the deposition temperature between, for instance, 30° C. and 90° C. (especially, when the metal element B of the second layer is iridium (Ir)). Further, by forming the third film at a high temperature compared with the deposition temperature, the crystalline third film which is resistant to the production of the hole in film is obtained. The microcrystalline second film is crystallized by heat treatment after forming the second film and before forming the third film, or heat treatment at the time of various processing after forming the third film.

The occurrence of conventional shirring is reduced owing to the present invention, the second film is obtained in a uniform crystalline state. As a result, also in the multi-wiring step, migration of hydrogen is partially blocked by the third film, and totally blocked by the second film, which has a higher degree of oxidation and uniformity. In other words, migration of hydrogen into the capacitor film is completely blocked by the second and third films, which results in substantial improvements in switching, initial, and retention characteristics of the device.

First Embodiment

Hereinafter, a first embodiment of the present invention will be explained.

In the first embodiment, a planar type ferroelectric random access memory will be explained, in which electric connection between the upper electrode and the lower electrode in a ferroelectric capacitor structure is established from the above. Note that the sectional structure of the ferroelectric random access memory will be explained here together with the method of manufacturing the memory for convenience sake.

Figure 4A:
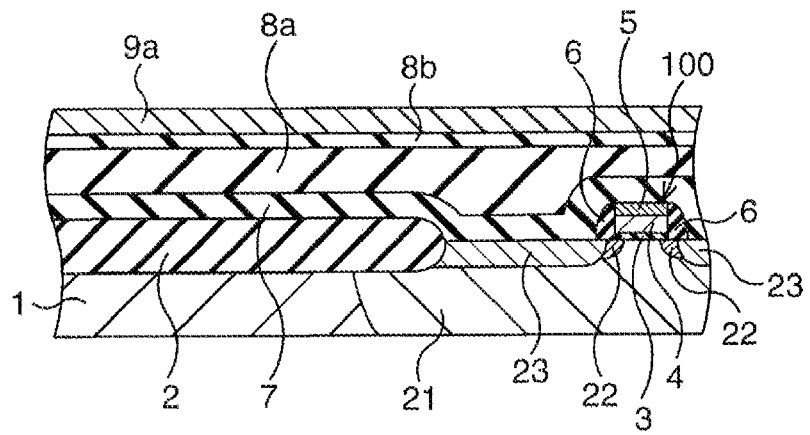
FIGS. 4A to 4O are cross sectional views showing a method of manufacturing a ferroelectric random access memory (semiconductor device) relating to a first embodiment in a process order.
Figure 4B:
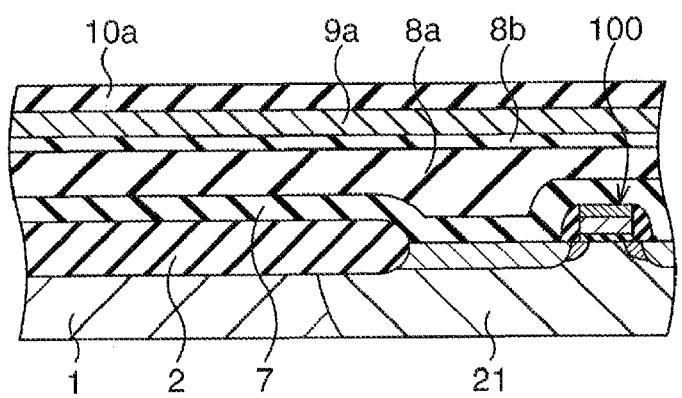
Figure 4C:
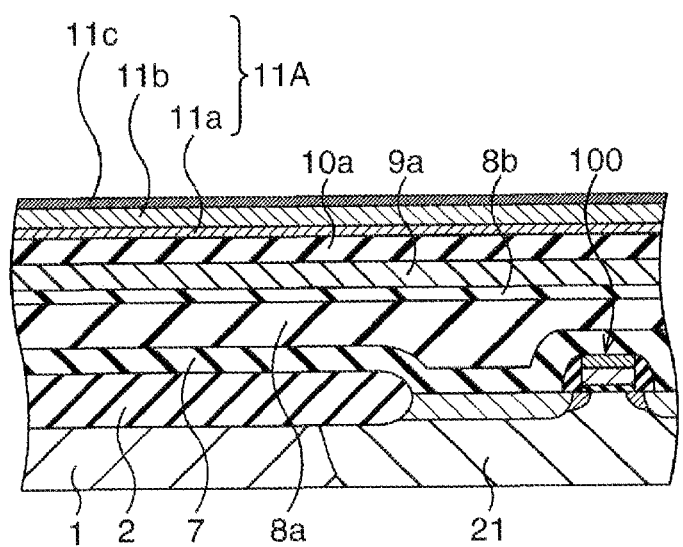
Figure 4D:
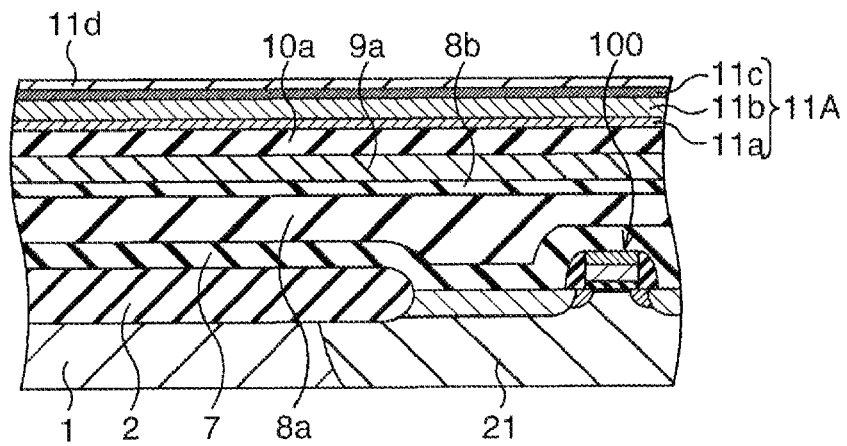
Figure 4E:
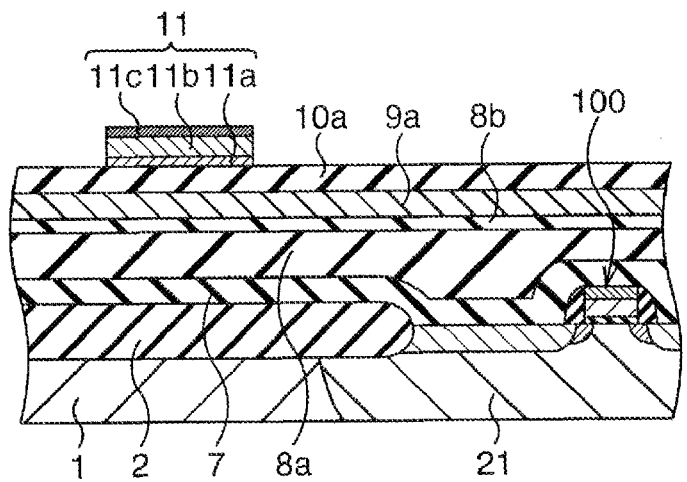
Figure 4F:
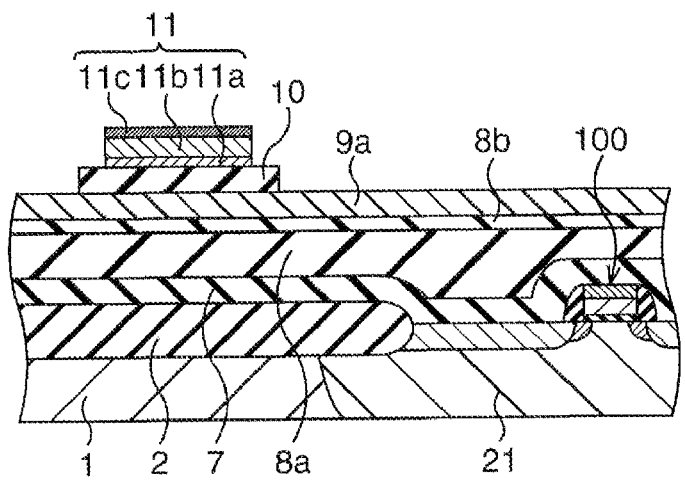
Figure 4G:
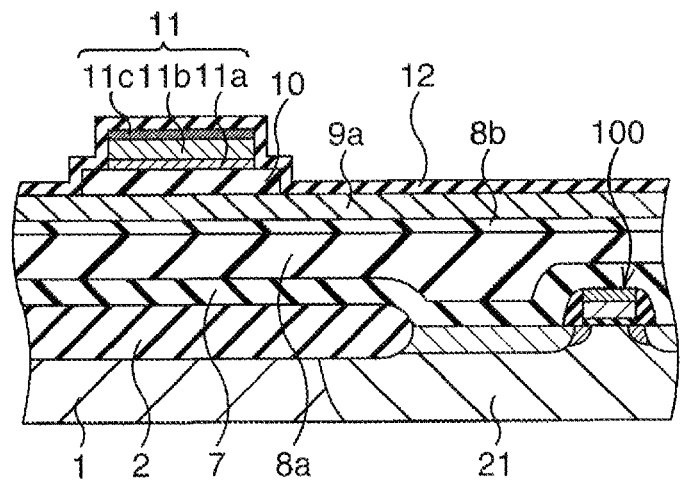
Figure 4H:
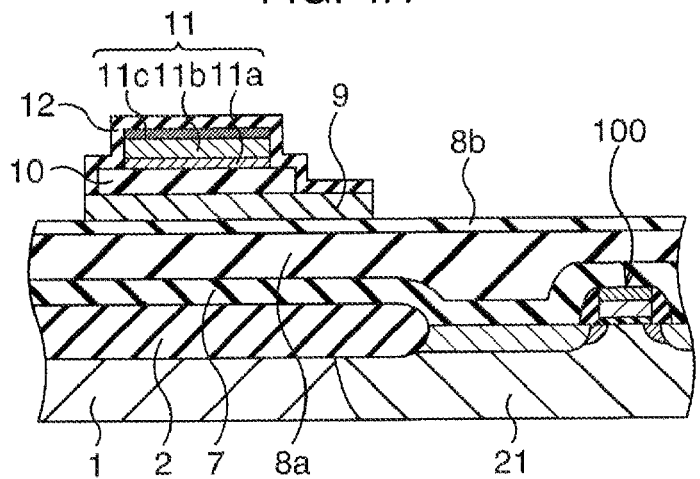
Figure 4I:
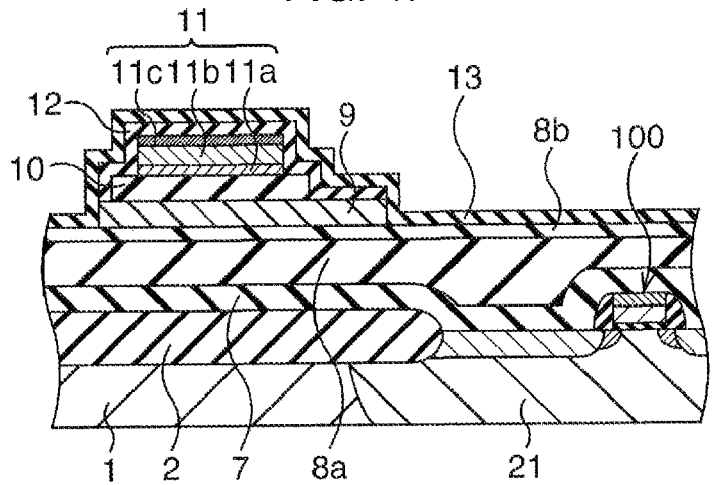
Figure 4J:
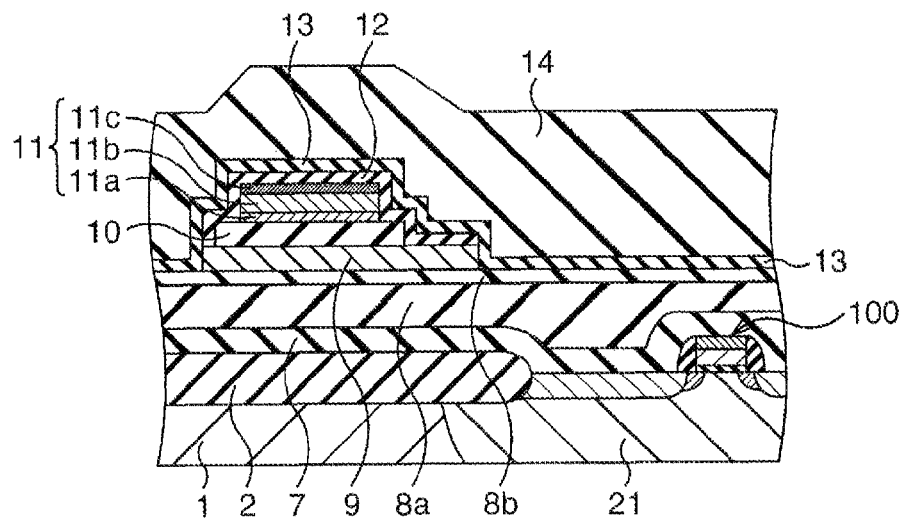
Figure 4K:
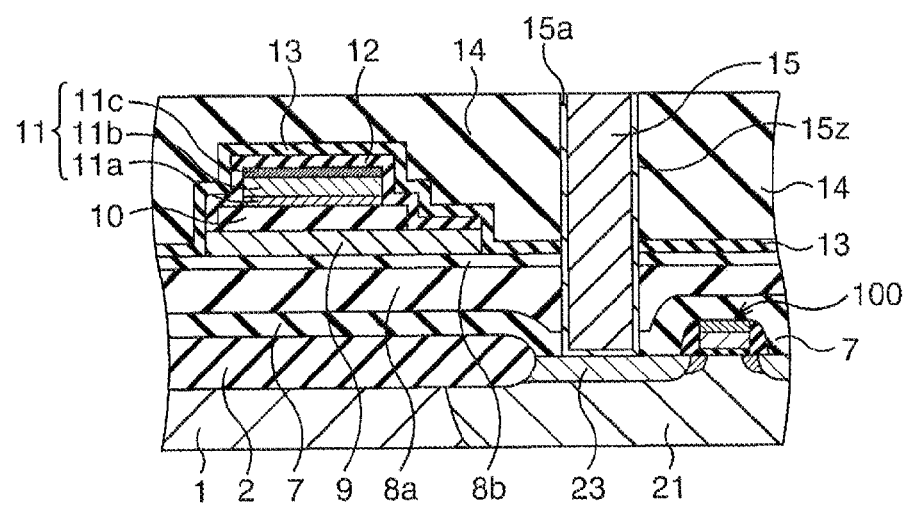
Figure 4L:
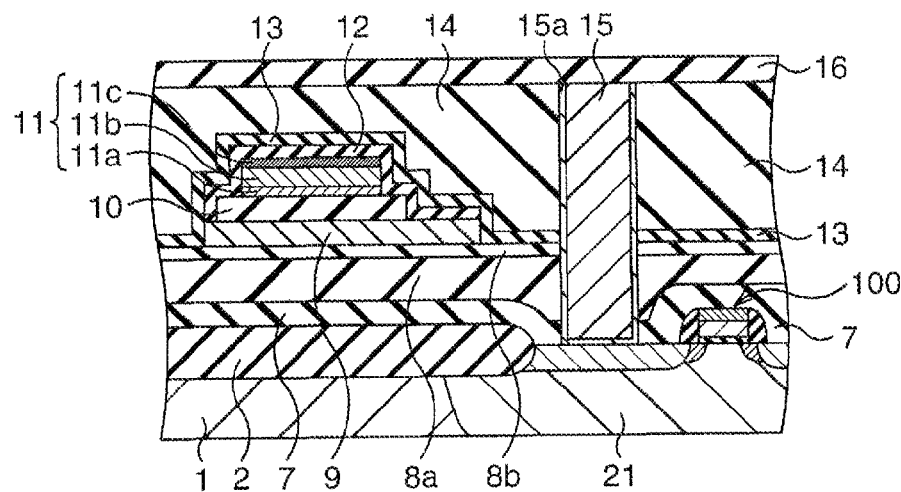
Figure 4M:
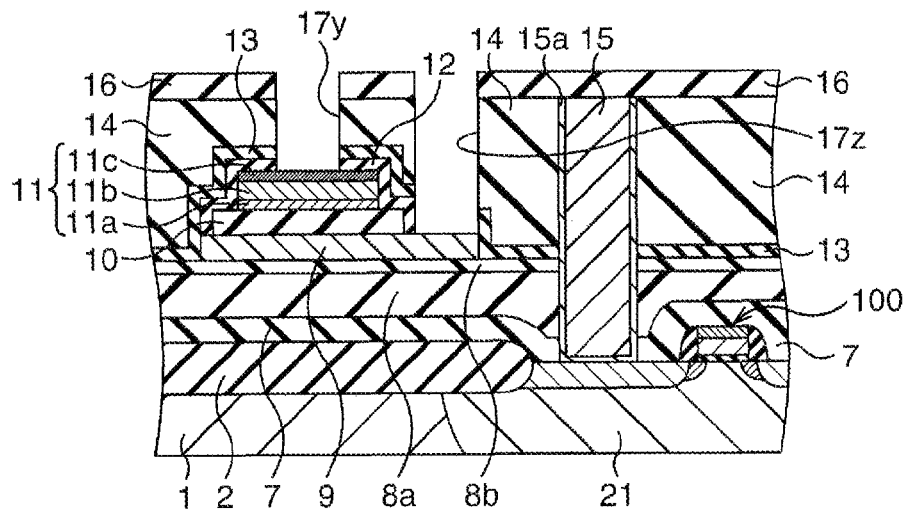
Figure 4N:
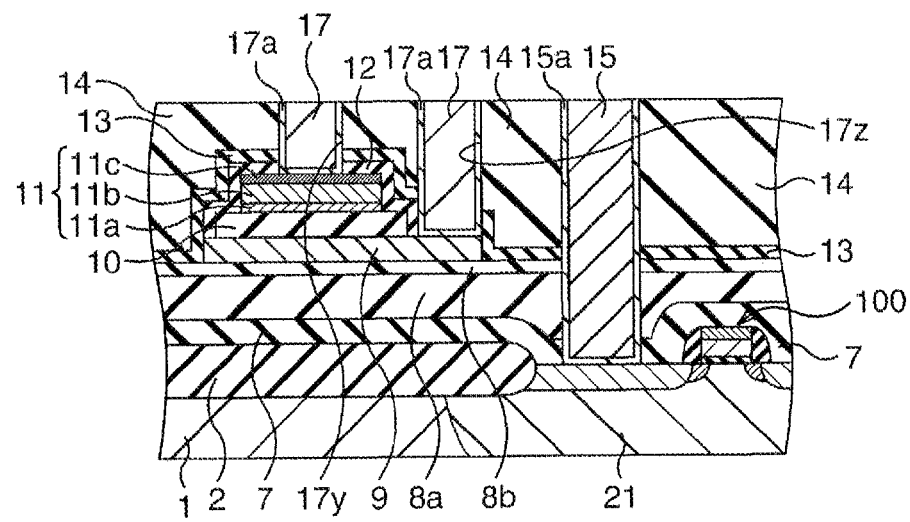
Figure 4O:
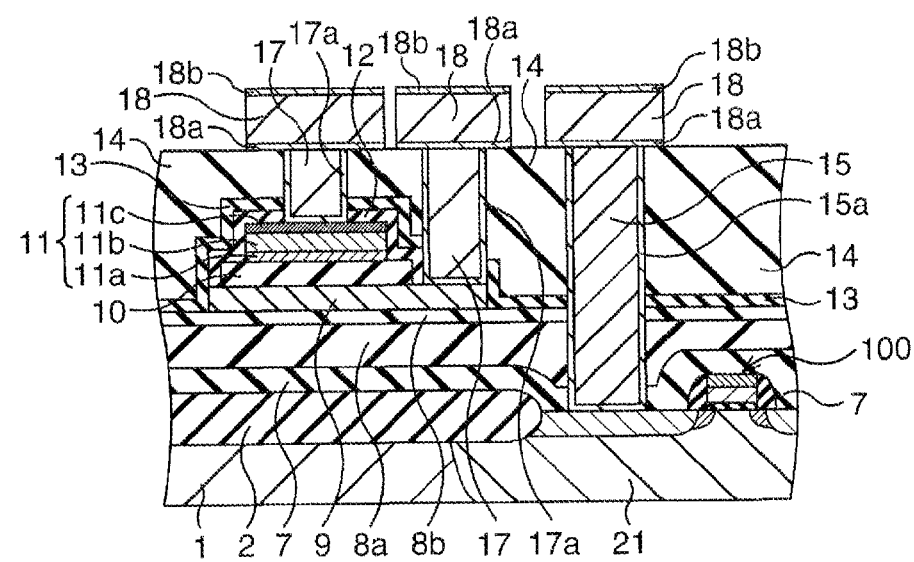

FIGS. 4A to 4O are sectional views showing the method of manufacturing the ferroelectric random access memory (semiconductor device) relating to the first embodiment in process order.

In the first embodiment, first, as shown in FIG. 4A, an element isolating and insulating film 2 is formed on and, for instance, a p-well 21 is formed in a semiconductor substrate 1, then, a MOSFET 100 is formed above the semiconductor substrate 1, and at the same time, a silicon oxynitride film 7, a silicon oxide film 8a, aluminum oxide ($Al_2O_3$) film 8b, and a lower electrode film 9a are formed above the MOSFET 100 in turn.

More specifically, first, the element isolating and insulating film 2 is formed in the element isolation area of the semiconductor substrate 1 such as a silicon (Si) substrate or the like by, for instance, the method of local oxidation of silicon (LOCOS) to determine the element formation area. Then, on the surface of the element formation area of the semiconductor substrate 1, for instance, boron (B) is ion planted under conditions of, for instance, energy 300 keV, and dose amount $3.0 \times 10^{13}$ cm$^{-2}$ to form the p-well 21. Then, above the semiconductor substrate 1, a silicon oxide film having a thickness of about 3 nm is formed by, for instance, the heat oxidation method. Then, above the silicon oxide film, a polycrystalline silicon film of about 180 nm in thickness is formed by the CVD method. Then, by conducting patterning to leave the polycrystalline silicon film and the silicon oxide film only in the element formation area, so that a gate insulation film 3 made from the silicon oxide film and a gate electrode 4 made of the polycrystalline silicon film are formed.

Then, using the gate electrode 4 as a mask, on the surface of the semiconductor substrate 1, for instance, phosphorus (P) is ion planted under conditions of, for instance, energy 20 keV, and dose amount $4.0 \times 10^{13}$ cm$^{-2}$ to form an n$^-$ type low concentration diffusion layer 22. Then, after forming the silicon oxide ($SiO_2$) film of about 300 nm in thickness on the whole surface by the CVD method, anisotropic etching is conducted to form a side wall 6, leaving the silicon oxide ($SiO_2$) film only on the side wall of the gate electrode 4.

Then, using the gate electrode 4 and the side wall 6 as a mask, on the surface of the semiconductor substrate 1, for instance, arsenic (As) is ion planted under conditions of, for instance, energy 10 keV, and dose amount $5.0 \times 10^{13}$ cm$^{-2}$ to form an n$^+$ type high concentration diffusion layer 23.

Then, for instance, a titanium (Ti) film is deposited on the whole surface by the sputtering method. Thereafter, by conducting heat processing between 400° C. and 900° C., a silicide reaction between the polycrystalline silicon film of the gate electrode 4 and the titanium (Ti) film takes place to form a silicide layer 5 above the upper surface of the gate electrode 4. Thereafter, the unreacted titanium (Ti) film is eliminated using hydrofluoric acid or the like. By this procedure, the MOSFET 100 is formed which is provided with the gate insulating film 3, the gate electrode 4, the silicide layer 5, the side wall 6 and a source/drain diffusion layer composed of the lower concentration diffusion layer 22 and the high concentration diffusion layer 23 is formed above the semiconductor substrate 1. It should be noted that the explanation is made using the formation of the n-channel type MOSFET as an example in this embodiment, and it is also possible to form a p-channel type MOSFET.

Then, the silicon oxynitride film 7 of about 200 nm in thickness is formed so as to cover the MOSFET 100 using the CVD method. Then, the silicon oxide film 8a of about 700 nm in thickness is formed above the silicon oxynitride film 7 by the CVD method. Thereafter, degassing of the silicon oxide film 8a is conducted by performing an annealing treatment at 650° C. for about 30 minutes in a nitrogen gas ($N_2$) atmosphere. Note that, the silicon oxynitride film 7 is formed to prevent hydrogen damage to the gate insulation film 3 or the like at the time of formation of the silicon oxide film 8a.

Then, the aluminum oxide ($Al_2O_3$) film 8b of about 20 nm in thickness is formed above the silicon oxide film 8a as a lower electrode adhering film by, for instance, the sputtering method. Note that, a titanium (Ti) film, a titanium oxide ($TiO_x$) film or the like of about 20 nm in thickness may be formed as a lower electrode adhering layer. Then, the lower electrode film 9a is formed above the aluminum oxide ($Al_2O_3$) film 8b. As the lower electrode film 9a, a platinum (Pt) film of about 150 nm in thickness is formed by, for instance, the sputtering method. It should be noted that when the lower electrode adhering film is a titanium (Ti) film of about 20 nm, a stacked product of the lower electrode adhering film made of the titanium (Ti) film and the lower electrode film 9a made of platinum of about 180 nm in thickness, may be formed. In this case, for instance, the titanium (Ti) film is formed at about 150° C., and the platinum (Pt) film is formed between 100° C. and 350° C.

The lower electrode film 9a may be formed of a metal film containing at least one kind of noble metal element selected from the group consisting of iridium, ruthenium, rhodium, rhenium, $SrRuO_3$, osmium, and paradium, instead of platinum.

Thereafter, as shown in FIG. 4B, a ferroelectric film 10a to be a capacitor film is formed in an amorphous state above the lower electrode film 9a. As the ferroelectric film 10a, the PLZT film of 100 nm to 200 nm in thickness is formed using, for instance, La doped PZT (PLZT: (Pb, La) (Zr, Ti) $O_3$) target by the RF sputtering method. Thereafter, a first heat treatment (RTA: Rapid Thermal Annealing) is conducted at 650° C. or lower in an atmosphere containing argon (Ar) and oxygen ($O_2$), and further, a second heat treatment (RTA) is conducted at a temperature higher than that for the first heat treatment, for instance, at about 750° C. in an oxygen atmosphere. Consequently, the ferroelectric film 10a is completely crystallized and, at the same time, the platinum (Pt) film forming the lower electrode film 9a is closely packed, so that mutual diffusion of platinum (Pt) and oxygen (O) near the interface between the lower electrode film 9a and the ferroelectric film 10a is suppressed.

It should be noted that though formation of the ferroelectric film 10a is conducted by the sputtering method in this embodiment, it is not limited to this method, and it is possible to form the ferroelectric film 10a by, for instance, the sol-gel method, the organometal decomposition method, the CSD method, the chemical-vapor deposition method, the epitaxial growth method, or the MO-CVD method.

As the ferroelectric film 10a, it is also adoptable to form compound films in a perovskite structure or in a bismuth (Bi) layer base structure, or a film whose crystal structure takes a perovskite structure or a bismuth (Bi) layer structure by heat treatment.

Then, as shown in FIG. 4C, an upper electrode film 11A is formed above the ferroelectric film 10a.

The upper electrode film 11A includes a first conductive oxidation layer 11a which is made up of an oxide, whose stoichiometric composition is expressed by a chemical formula $M_1O_{x1}$ using a composition parameter $x_1$, and whose practical composition is expressed by a chemical formula $M_1O_{x2}$ using a composition parameter $x_2$, a second conductive oxidation layer 11b made of an oxide formed above the first conductive oxidation layer 11a, and its stoichiometric composition is expressed by a chemical formula $M_2O_{y1}$ using a composition parameter $y_1$, and its practical composition is expressed by a chemical formula $M_2O_{y2}$ using a composition parameter $y_2$, and a third conductive oxidation layer 11c made of an oxide formed above the second conductive oxidation layer 11b, and its stoichiometric composition is expressed by a chemical formula $M_3O_{z1}$ using a composition parameter $z_1$, and its practical composition is expressed by a chemical formula $M_3O_{z2}$ using a composition parameter $z_2$. Here, the second conductive oxidation layer 11b has a degree of oxidation higher than the first and the third conductive oxidation layers 11a and 11c, and the composition parameters $x_1$, $x_2$, $y_1$, $y_2$, $z_1$ and $z_2$ have the following relations therebetween, $y_2/y_1 > x_2/x_1$, $y_2/y_1 > z_2/z_1$, and $z_2/z_1 \geq x_2/x_1$. In the present embodiment, the case that all of $M_1$, $M_2$ and $M_3$ are taken as iridium (Ir), and, for instance, $x_2$ is about 1.9, $y_2$ is about 2.1 and $z_2$ is about 2.0, will be instantiated (note that these values are results of the HRBS analysis). In this case, x1, $y_1$ and $z_1=2$. Hereinafter, $x_2$, $y_2$ and $z_2$ will be described as x, y and z respectively, for the convenience sake in the description.

When forming the upper electrode film 11A, the first conductive oxidation layer 11a is formed above the ferroelectric film 10a.

An IrOx film, which is formed by crystallization at the time of deposition, is deposited above the ferroelectric film 10a in film thickness of 20 nm to 50 nm by, for instance, the sputtering method to form the first conductive oxidation layer 11a. The deposition temperature at this time is set to, for instance, 300° C., argon (Ar) gas and oxygen ($O_2$) are used as the deposition gas, and the flow rate of the deposition gases is set to be 140 sccm for argon, and 60 sccm for oxygen ($O_2$). The sputtering power is about 1 kW.

Then, the second conductive oxidation layer 11b is formed above the first conductive oxidation layer 11a.

Here, a preliminary study of the deposition temperature of an iridium oxide ($IrO_y$) film which will be the second conductive oxidation layer 11b is conducted. The iridium oxide ($IrO_y$) film is deposited in a film thickness of about 100 nm above a silicon (Si) substrate on the surface of which, for instance, a silicon oxide film is deposited. Here, the deposition temperatures are controlled at 50° C., 75° C., 100° C., 150° C., 200° C., and 250° C., and the iridium oxide (IrOy) films are studied to ascertain deposition according to the respective temperatures. As a result of the preliminary study, it is found that when the deposition temperature is set to 150° C. or more, the iridium oxide ($IrO_y$) is completely crystallized, but due to abnormal growth of the iridium oxide ($IrO_y$), a smooth surface morphology cannot be obtained. When the deposition temperature is set to 100° C. or lower, iridium oxide ($IrO_y$) crystallizes in a state where microcrystals and crystals exist in a mixture together. Furthermore, when iridium oxide ($IrO_y$) in a uniform microcrystalline state is obtained by setting the deposition temperature 75° C. or lower, and an extremely smooth surface morphology is confirmed. Considering that when the deposition temperature is set lower than 50° C., insufficient microcrystals are obtained, the suitable deposition temperature for iridium oxide ($IrO_y$) film which will be the second conductive oxidation layer 11b must be between 50° C. and 75° C. Considering further that specifications of various deposition apparatuses differ from each other, and the crystallization temperatures of noble metal oxides differ, it is possible to conclude that the suitable temperature for deposition is within the range of 30° C. to 90° C.

Based on the result of the above-described preliminary study, iridium oxide ($IrO_y$) film is deposited in a film thickness of 30 nm to 50 nm above the first conductive oxidation layer 11a by, for instance, the sputtering method to form the second conductive oxidation layer 11b. At this time, the deposition temperature is set between 30° C. and 100° C., more preferably within 50° C. to 75° C., so that the iridium oxide ($IrO_y$) is controlled to be deposited in a microcrystalline state. Argon (Ar) and oxygen ($O_2$) are used as the deposition gas, and the flow rate of the deposition gas is controlled at, for instance, 100 sccm of argon (Ar), and 100 sccm of oxygen ($O_2$) so that the content of oxygen ($O_2$) in the deposition gas is higher than that of the first conductive oxidation layer 11a (so that the content of oxidation is higher than that at the time of forming the first conductive oxidation layer 11a). The sputtering power is adjusted to, for instance, about 1 kW. At this time, no abnormal oxidation occurs in the second conductive oxidation layer 11b, and iridium oxide ($IrO_y$) having a composition of a uniform microcrystalline state is obtained.

Next, the third conductive oxidation layer 11c is formed above the second conductive layer 11b.

An iridium oxide ($IrO_z$) film is deposited in a thickness of 20 nm to 50 nm above the second conductive oxidation layer 11b by, for instance, the sputtering method to form the third conductive oxidation layer 11c. At this time, the deposition temperature is within the range of 150° C. to 400° C., for instance, at 300° C., so as to control the way that the iridium oxide ($IrO_z$) crystallizes during deposition. Argon (Ar) and oxygen ($O_2$) are used as the deposition gas, and the flow rate of the deposition gas is controlled to be, for instance, 110 sccm of argon (Ar), and 90 sccm of oxygen ($O_2$) so that the content of oxygen ($O_2$) in the deposition gas is lower than that in the second conductive oxidation layer 11b (so that the degree of oxidation is lower than during the formation of the second conductive oxidation layer 11b). The sputtering power is adjusted to, for instance, about 1 kW. At this time, no abnormal oxidation occurs in the third conductive oxidation layer 11c, and the iridium oxide ($IrO_z$) has a composition of uniform crystallinity.

Here, formation of the third conductive oxidation layer 11c with a film thickness of 30 nm or less can be achieved by controlling the content of oxygen ($O_2$) in the deposition gas to be about 45%. When the thickness of the third conductive oxidation layer 11c is required to further increase, it is necessary to control the content of oxygen ($O_2$) in the deposition gas so as to be lower than 45%. Formation of the third conductive oxidation layer 11c without occurrence of abnormal growth thereof on the surface of iridium oxide (IrOz) can be achieved by controlling the content of oxygen ($O_2$) between 10% and 50%, more preferably within the range 30% to 45%. For instance, in order to form the third conductive oxidation layer 11c with a thickness of about 50 nm, the content of oxygen ($O_2$) in the deposition gas is set to about 35%.

As above, the upper electrode film 11A composed of the first conductive oxidation layer 11a, the second conductive oxidation layer 11b and the third conductive oxidation layer 11c stacked in turn is formed above the ferroelectric film 10a.

Note that as shown in FIG. 4D, the upper electrode film can be formed by depositing a fourth layer 11d made of noble metals such as iridium (Ir), rubidium (Ru) or an alloy containing such a noble metal above the third conductive oxidation layer 11c. In this case, the upper electrode in a four layered structure is formed by etching these in the following processes. In the following explanation, the formation of the upper electrode by processing the upper electrode film 11A in a three layered structure not including the fourth layer 11d will be explained.

Note that as with the crystallization process by heat treatment of the ferroelectric film 10a, the following methods can be cited except those described above.

As a first method, in the process shown in FIG. 4B, the first heat treatment (RTA) is conducted at 650° C. or lower, for instance, at 560° C. in an atmosphere containing argon (Ar) and oxygen ($O_2$), and after forming the first conductive oxidation layer 11a, the second heat treatment (RTA) is conducted at a temperature higher than that used in the first heat treatment, for instance, within the range of 650° C. to 750° C. (for instance, at 725° C.) in an oxygen atmosphere to completely crystallize the ferroelectric film 10a. Here, when forming the first conductive oxidation layer 11a, in the case of the deposition at room temperature, the flow rate of the deposition gas is controlled to, for instance, 100 sccm for argon (Ar), and 56 sccm for oxygen ($O_2$), and the sputtering power is at 2 kW. In the case of the deposition at high temperatures, the deposition temperature is adjusted to, for instance, 300° C., the flow rate for argon (Ar) is controlled to 140 sccm, for oxygen ($O_2$), to 60 sccm, and for the sputtering power, controlled at 1 kW. The above-described heat treatment works for complete crystallization of the ferroelectric film 10a, and at the same time, for the flattening of the interface between the ferroelectric film 10a and the first conductive oxidation layer 11a. By this first method, it is possible to improve the operation at a low voltage and the switching charge of the ferroelectric capacitor structure.

As a second method, after forming the ferroelectric film 10a, the first heat treatment is conducted similarly to the first method, and an amorphous ferroelectric film (not shown) thinner than the ferroelectric film 10a is formed. Thereafter, similarly to the first method, the second heat treatment is conducted after forming the first conductive oxidation layer 11a. According to the second method, the leakage current of the ferroelectric capacitor structure can be reduced as well as an improvement in performance at low voltages and the switching charge of the ferroelectric capacitor structure.

As a third method, when the ferroelectric film 10a is crystallized without requiring the first heat treatment, a thin amorphous ferroelectric film as it is and the first conductive oxidation layer 11a are formed.

As a fourth method, after crystallizing the ferroelectric film 10a, or after crystallizing the ferroelectric film 10 and a thin amorphous ferroelectric film and then the second conductive oxidation layer 11b is formed, heat treatment (RTA) is conducted again at a temperature between 650° C. and 750° C., for instance, at 700° C. According to this method, it is possible to improve the adherence between an upper electrode 11 and the ferroelectric film 10, which will be described later and the crystal state of the upper electrode 11 can be further improved.

In the present embodiment, although the example of forming the first conductive oxidation layer 11a, the second conductive oxidation layer 11b and the third conductive oxidation layer 11c composing the upper electrode film 11A with iridium oxide is shown, the present invention is not limited to this, and it is also possible to apply a film made of at least one kind of oxide selected from, for instance, the group consisting of platinum oxide, ruthenium oxide, strontium.ruthenium oxide, rhodium oxide, rhenium oxide, osmium oxide and palladium oxide to the respective layers 11a to 11c. In this case, a method of conducting sputtering using a target containing at least one kind of noble metal element selected from the group consisting of platinum (Pt), ruthenium (Ru) strontium (Sr) and ruthenium, rhodium (Rh), rhenium (Re), osmium (Os) and palladium (Pd) under conditions where oxidation of noble metals occurs.

In this case, there could be various combinations such as, the metal element $M_1$ of the first conductive oxidation layer 11a and the metal element $M_2$ of the second conductive oxidation layer 11b may be made of different metals from each other, the metal element $M_1$ of the first conductive oxidation layer 11a and the metal element $M_3$ of the third conductive oxidation layer 11c may be made of different metals from each other, or two types of the respective metal elements in the first to third conductive oxidation layers 11a to 11c may be the same, but the remaining one may be different from others.

Then, after conducting back cleaning of the semiconductor substrate 1, as shown in FIG. 4E, the upper electrode 11, which is composed of stacked first, second and third conductive oxidation layers 11a to 11c is formed by etching the lower electrode film 11A. Thereafter, recovery annealing at about 650° C. for about 60 minutes is conducted in an oxygen (O2) atmosphere. This heat treatment serves to repair some physical damage or the like which the ferroelectric film 10a received when the upper electrode 11 was formed.

Then, as shown in FIG. 4F, the ferroelectric film 10 which will be the capacitor film of the ferroelectric capacitor is formed by patterning the ferroelectric film 10a. Thereafter, oxygen annealing for the prevention of the peeling of the aluminum oxide ($Al_2O_3$) film, which will be formed later, is conducted.

Then, as shown in FIG. 4G, an aluminum oxide ($Al_2O_3$) film 12 serving as a protection film is formed above the whole surface by the sputtering method. Thereafter, in order to alleviate damages by sputtering, oxygen annealing is conducted. Owing to this aluminum oxide ($Al_2O_3$) film 12, migration of hydrogen into the ferroelectric capacitor structure from the outside is prevented.

Then, as shown in FIG. 4H, by conducting patterning of the aluminum oxide ($Al_2O_3$) film 12 and the lower electrode film 9a, the lower electrode 9 is formed. Thereafter, oxygen annealing for prevention of peeling of an aluminum oxide ($Al_2O_3$) film, which will be described later is conducted.

Then, as shown in FIG. 4I, an aluminum oxide ($Al_2O_3$) film 13 which serves as a protection film is formed above the whole surface by the sputtering method. Thereafter, in order to reduce capacitor leakage, oxygen annealing is conducted.

Then, as shown in FIG. 4J, an interlayer insulating film 14 is formed above the whole surface by the high density plasma CVD (HDP-CVD) method. The film thickness of the interlayer insulating film 14 is adjusted to, for instance, about 1.5 μm.

Then, as shown in FIG. 4K, flattening of the interlayer insulating film 14 is conducted by the chemical mechanical polishing (CMP) method. Thereafter, plasma treatment using nitrogen oxide ($N_2O$) gas is conducted. As a result, the surface of the interlayer insulating film 14 is somewhat nitrided and moisture migration into the inside becomes difficult. Note that the plasma treatment is effective if a gas containing at least either nitrogen (N) or oxygen (O) is used. Then, a via hole 15z arriving at a high concentration diffusion layer 23 of the MOSFET 100 is formed in the interlayer insulating film 14, the aluminum oxide ($Al_2O_3$) film 13, the aluminum oxide ($Al_2O_3$) film 8b, the silicon oxide film 8a and the silicon nitride film 7. Thereafter, a glue film 15a is formed on the inside wall of the via hole 15z by stacking a titanium (Ti) film and a titanium nitride (TiN) film in turn in the via hole 15z by the sputtering method. Then, after stacking a tungsten (W) film with a thickness sufficient to fill in the via hole 15z by the CVD method, a tungsten (W) plug 15 is formed in the via hole 15z by conducting flattening of the tungsten (W) film until the surface of the interlayer insulating film 14 is exposed by the CMP method.

Then, as shown in FIG. 4L, a silicon oxynitride film 16 serving as an oxidation protection film for the tungsten (W) plug 15 is formed by, for instance, the plasma speed accelerating CVD method.

Then, as shown in FIG. 4M, a via hole 17y arriving at the upper electrode 11 and a via hole 17z arriving at the lower electrode 9 are formed through a silicon oxynitride (SiON) film 16, the interlayer insulating film 14, the aluminum oxide ($Al_2O_3$) film 13 and the aluminum oxide ($Al_2O_3$) film 12 by etching. Thereafter, oxygen annealing is conducted for the repair of damages to the ferroelectric film 10 caused by the etching.

Then, as shown in FIG. 4N, the surface of the tungsten (W) plug 15 is exposed by eliminating the silicon oxynitride (SiON) film 16 across the whole surface by etch back. Thereafter, a glue film 17a is formed on the inside wall of the respective via holes by stacking a titanium (Ti) film and a titanium nitride (TiN) film in turn in the via holes 17y and 17z by the sputtering method. Then, after stacking a tungsten (W) film with a sufficient thickness to fill the respective via holes 17y and 17z by the CVD method, a tungsten (W) plug 17 is formed in the via holes 17y and 17z by conducting flattening of the tungsten (W) film until the surface of the interlayer insulating film 14 is exposed by the CMP method.

Then, as shown in FIG. 4O, a metal wiring layer composed of a glue film 18a, a wiring film 18 and a glue film 18b is formed.

Concretely, a titanium (Ti) film about 60 nm thick, a titanium nitride (TiN) film about 30 nm thick, an aluminum copper (AlCu) alloy film about 360 nm thick, a titanium (Ti) film about 5 nm thick and a titanium nitride (TiN) film about 70 nm thick are stacked first above the whole surface by, for instance, the sputtering method in turn. Then, a metal wiring layer composed of the glue film 18a formed from a titanium (Ti) film and a titanium nitride (TiN) film, a wiring film 18 formed from the aluminum copper (AlCu) alloy film, and the glue 18b formed from a titanium (Ti) film and a titanium nitride (TiN) film is formed above the respective tungsten (W) plugs 15 and 17 by patterning the stacked film into a prescribed shape using the photolithography technology. At this time, the metal wiring layer connecting to the tungsten (W) plug 15, and the metal wiring layer connecting to the upper electrode 11 or the metal wiring layer connecting to the lower electrode 9 are connected with a portion of the wiring film 18 to each other.

Thereafter, furthermore, formation of an interlayer insulating film, formation of a contact plug and formation of wiring on the second layer and the following layers thereafter from the bottom are conducted. Then, a cover film composed of, for instance, a tetraethyl orthosilicate (TEOS), an oxide film and a silicon nitride (SiN) film is formed to complete a ferroelectric random access memory relating to the present embodiment having a ferroelectric capacitor structure provided with the lower electrode 9, the ferroelectric film 10 and the upper electrode 11.

Here, regarding to the first to third conductive oxidation layers 11a to 11c which form the lower electrode film 11A, each degree of oxidation is studied. Concretely, the degree of oxidation for an $IrO_x$ film, an $IrO_y$ film and an $IrOz$ film based on the stoichiometric composition $IrO_2$ (x, y, z=2) is measured using a high resolution Rutherford back-scattering spectrometry (RBS) analyzer. The measurement result is shown in Table 1 below.

TABLE 1

| conductive oxidation film | deposition temperature | deposition gas Ar:$O_2$ (Sccm) | HRBS result × (IrOx) |
|---|---|---|---|
| IrOx | 20° C. | 100:52 | 1.20 |
| IrOx | 20° C. | 100:59 | 1.50 |
| IrOx | 300° C. | 140:60 | 1.92 |
| IrOy | 20° C. | 100:100 | 2.10 |
| IrOy | 60° C. | 100:100 | 2.10 |
| IrOz | 300° C. | 120:80 | 2.02 |
| IrOz | 300° C. | 110:90 | 2.04 |

As clearly understood from table 1, the degree of oxidation is higher in the $IrO_y$ film than in the $IrO_x$ film, and especially, the $IrO_y$ film has a nearly ideal stoichiometeric composition. A conductive oxidation layer in a crystalline state is more likely to grow abnormally than the conductive oxidation layer in a microcrystalline state. The abnormal growth depends on the deposition temperature, the throwing power at the time of deposition, and the film thickness. When depositing at a high temperature, the film is completely crystallized. However, abnormal growth takes place also on the surface at the time of crystallization.

The experimental result shows that when an iridium oxide film about 50 nm thick is deposited at a deposition temperature of 300° C., with 1 kW of sputtering power, abnormal growth cannot be seen on the film surface provided that the content of oxygen ($O_2$) in the deposition gas is 35% or more. When an iridium oxide film about 25 nm thick is deposited, abnormal growth cannot be seen on the film surface provided that the content of oxygen ($O_2$) in the deposition gas is 45% or lower. When the throwing power at the time of deposition is low, a long deposition time is required, the degree of oxidation of the obtained film is high and abnormal growth easily occurs. On the contrary, when the throwing power at the time of deposition is high, the degree of oxidation of the obtained film is low and abnormal growth is restricted.

When the deposition temperature is low, for instance, when an iridium oxide film in a microcrystalline state is deposited at 60° C., no abnormal growth occurs on the surface even when the content of oxygen ($O_2$) in the deposition gas is 50%, even when the film thickness is formed to be 150 nm. In order to prevent process deterioration, it is necessary for the upper electrode that the degree of oxidation of the conductive oxide to be used for the material be high, and no abnormal growth and no hole in film occur. Note that the crystal particle size of an iridium oxide film varies according to the conditions of deposition. When the degree of oxidation is low at a high deposition temperature, the crystal particle size of the iridium oxide film becomes a very small stone wall shape or is a columnar shape. When the degree of oxidation is high, the crystal particle size is large. On the other hand, the iridium oxide film deposited at a low temperature is composed of a uniform microcrystals, and by the following heat treatment, they become a columnar shape. Its crystal size is larger than that deposited at a high temperature. Accordingly, in the present embodiment, the crystal particle sizes of the first, second and third conductive oxidation layers 11a to 11c forming the upper electrode 11 are small, large and middle in this order.

In the present embodiment, as described above, above the first conductive oxidation layer 11a, the second conductive oxidation layer 11b, which is higher than the first conductive oxidation layer 11a in its degree of oxidation, and the crystallized third conductive oxidation layer 11c, are formed, and furthermore, a structure forming a noble metal film is taken according to circumstances. By this structure, occurrence of abnormal growth of the crystal is suppressed in the upper electrode 11. In the case of the ferroelectric capacitor structure formed by this method, the ferroelectric film 10 and the upper electrode film 11 are resistant to reaction, formation of an interface layer is suppressed and in addition to that, the growth of a macro-sized crystal is suppressed. Accordingly, in the heat treatment to be conducted later in a reducing atmosphere, the diffusion of hydrogen occurs with difficulty and the ferroelectric film is resistant to reduction. As a result, it is possible to obtain favorable capacitor characteristics.

In general, iridium (Ir) or platinum (Pt) in a metallic state is widely known as being a catalyst for hydrogen. That is, hydrogen is activated when it comes into contact with iridium (Ir) and platinum (Pt) in a metallic state. When iridium (Ir) or platinum (Pt) is used as a single film in the upper electrode, it easily causes process deterioration. Accordingly it cannot be used. If iridium (Ir) or platinum (Pt) in a metallic state is formed directly above the first conductive oxidation layer, process deterioration can easily occur even in the upper electrode. For instance, the switching charge of the ferroelectric capacitor structure after forming the three-layered wiring becomes 50% or less compared with that before forming the wiring. This means that in the IrOx film (x=1.3 to 1.8), which is the first conductive oxidation layer, since the value of the composition parameter x is smaller than stoichiometric composition x=2.0, oxidation loss occurs, and the oxide component and the metal component exist in a mixture. Hydrogen produced in the forming step of an interlayer insulating film or in the forming step of wiring is activated, and the capacitor characteristics are deteriorated by such activated hydrogen.

It is considered that since the IrOy film and the IrOz film (y, z≈2) in the second and the third conductive oxidation layer, of which composition are close to the stoichiometric composition, have a few oxidation loss and contain few metallic iridium (Ir), hydrogen is resistant to be activated and the capacitor characteristic is kept at a high level without deterioration even after forming a multi-wiring structure above the ferroelectric capacitor structure.

In other words, according to the present embodiment, it is possible to improve the interface condition between the upper electrode and the ferroelectric film and the process deterioration. As a result, the switching charge is elevated, the coercive voltage is reduced, and the fatigue loss and the imprint are improved. This type of a ferroelectric capacitor structure is quite suitable for a next-generation ferroelectric random access memory working at a low voltage.

Second Embodiment

The second embodiment of the present invention will be explained next.

In the first embodiment, a planar type ferroelectric random access memory was explained, but in the second embodiment, a stack type ferroelectric random access memory, in which electric connection of the upper electrode of the ferroelectric capacitor is taken from above, and electric connection of the lower electrode of the ferroelectric capacitor is taken from below, will be explained. Note that the sectional structure of the ferroelectric random access memory will be explained together with its manufacturing method.

FIGS. 5A to 5L are sectional views showing the manufacturing method of the ferroelectric random access memory (semiconductor device) relating to the second embodiment in process order.

Figure 5A:
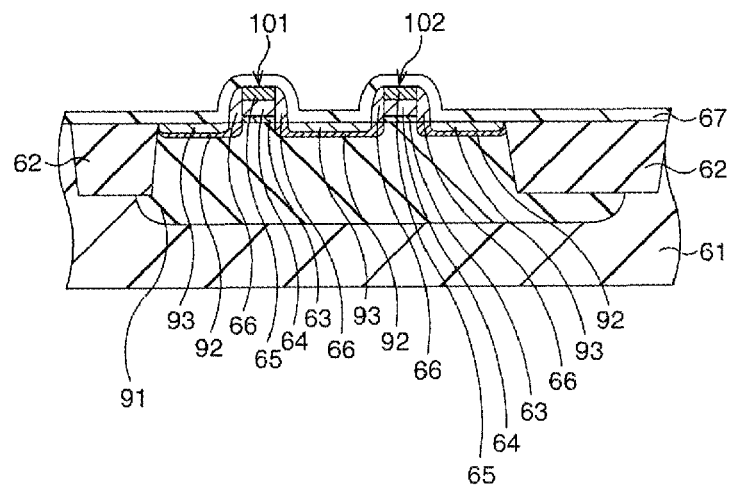
FIGS. 5A to 5L are cross sectional views showing a method of manufacturing a ferroelectric random access memory (semiconductor device) relating to a second embodiment in a process order.

In the second embodiment, first, as shown in FIG. 5A, for instance, a p-well 91 is formed from an element isolating and insulating film 62 above a semiconductor substrate 61, and moreover, the MOSFETs 101 and 102 are formed above the semiconductor substrate 61, and at the same time, a silicon oxynitride (SiON) film 67 covering each MOSFET is formed.

Concretely, first, the element isolating and insulating film 62 is formed in the element isolation area of the semiconductor substrate 61 such as silicon (Si) substrate by, for instance, the shallow trench isolation (STI) method so as to determine the element formation area. Then, in the surface of the element formation area of the semiconductor substrate 61, for instance, boron (B) is ion implanted under the following conditions, for instance, 300 keV in energy, $3.0 \times 10^{13}$ $cm^{-2}$ in dose amount to form the p-well 91. Thereafter, a silicon oxide film of about 3 nm in thickness is formed on the semiconductor substrate 61 by, for instance, heat oxidation method. Then, a polycrystalline silicon film of about 180 nm in thickness is formed on the silicon oxide film by the CVD method. Then, patterning to leave the polycrystalline silicon film and the silicon oxide film on only the element formation area is conducted to form a gate insulating film 63 made from the silicon oxide film and a gate electrode 64 made from the polycrystalline silicon film.

Then, using the gate electrode 64 as a mask, for instance, phosphorus (P) is ion implanted on the surface of the semiconductor substrate 61 under the following conditions, 13 keV in energy, $5.0 \times 10^{14}$ $cm^{-2}$ in dose amount to form an n⁻ type low concentration diffusion layer 92. Then, after forming a silicon oxide ($SiO_2$) film of about 300 nm in thickness on the whole surface by the CVD method, anisotropic etching is conducted to form a side wall 66, leaving the silicon oxide ($SiO_2$) film only on the side wall of the gate electrode 64.

Then, using the gate electrode 64 and the side wall 66 as a mask, for instance, arsenic (As) is ion implanted on the surface of the semiconductor substrate 61 under the following conditions, 10 keV in energy, $5.0 \times 10^{14}$ $cm^{-2}$ in dose amount to form an n⁺ type high concentration diffusion layer 93.

Then, for instance, a titanium (Ti) film is deposited on the whole surface by the sputtering method. Thereafter, by conducting heat treatment at 400° C. to 900° C., the polycrystalline silicon film and the titanium (Ti) film of the gate electrode 64 are allowed to react and form a silicide layer 65 above the upper surface of the gate electrode 64. Thereafter, the unreacted titanium (Ti) film is removed by using hydrofluoric acid or the like. By these procedures, the MOSFETs 101 and 102 provided with a source/drain diffusion layer including the gate insulating film 63, the gate electrode 64, the silicide layer 65, the side wall 66, and the low concentration diffusion layer 92 and the high concentration diffusion layer 93 are formed. It should be noted that in the present embodiment, the explanation was made by using an example of forming the n-channel type MOSFET, and it is also possible to form a p-channel type MOSFET. Then, the silicon oxynitride (SiON) film 67 of about 200 nm in thickness is formed on the whole surface by the plasma CVD method.

Figure 5B:
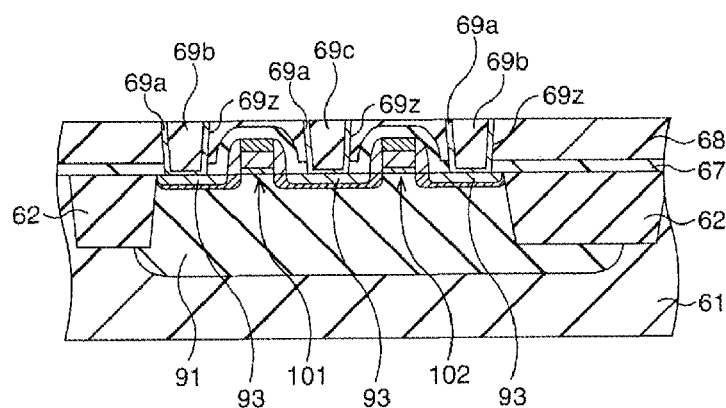

Next, as shown in FIG. 5B, after depositing a silicon oxide film of about 1000 nm in thickness on the silicon oxynitride (SiON) film 67 by the plasma CVD, it is flattened by the CMP method to form an interlayer insulating film 68 about 700 nm thick and made of a silicon oxide film. Then, via holes 69z having a diameter of, for instance, about 0.25 μm arriving at the high concentration diffusion layers 93 of the respective MOSFETs, are formed in the interlayer insulating film 68 and the silicon oxynitride (SiON) film 67. Thereafter, in the via holes 69Z, glue films 69a are formed by stacking a titanium (Ti) film of about 30 nm in thickness and a titanium nitride (TiN) film of about 20 nm in thickness in turn by the sputtering method. Then, furthermore, after depositing a tungsten (W) film having a thickness sufficient enough to fill the respective via holes 69z, tungsten (W) plugs 69b and 69c are formed in the via holes 69z by flattening the tungsten (W) film till the surface of the interlayer insulating film 68 is exposed by the CMP method. Here, the tungsten (W) plug 69b is that connecting to one of source/drain diffusion layers of the respective MOSFET, and the tungsten (W) plug 69c is that connecting to the other of the source/drain diffusion layers.

Figure 5C:
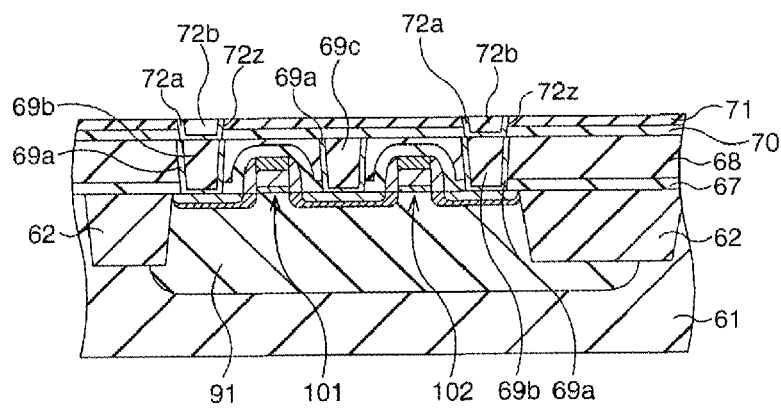

Next, as shown in FIG. 5C, a silicon oxynitride (SiON) film 70 to be an oxidation protection film of about 130 nm in thickness is formed above the whole surface by the plasma CVD method. Then, an interlayer insulating film 71 made of a silicon oxide film of about 300 nm in thickness is formed above the silicon oxynitride (SiON) film 70 by the plasma CVD method using TEOS as a raw material. Then, via holes 72z of about 0.25 μm in diameter for instance, which expose the surfaces of the tungsten (W) plug 69b are formed in the interlayer insulating film 71 and the silicon oxynitride (SiON) film 70. Thereafter, in the via holes 72z, glue films 72a are formed by stacking a titanium (Ti) film of about 30 nm in thickness and a titanium nitride (TiN) film of about 20 nm in thickness in turn by the sputtering method. Then, furthermore, after depositing a tungsten (W) film having the thickness sufficient enough to fill the respective via holes 72z by the CVD method, tungsten (W) plugs 72b are formed in the via holes 72z by flattening the tungsten (W) film till the surface of the interlayer insulating film 71 is exposed by the CMP method.

Thereafter, the surface of the interlayer insulating film 71 is processed with ammonia ($NH_3$) plasma, so that the NH group is bonded to an oxygen atom on the surface of the interlayer insulating film 71. This ammonia plasma treatment is conducted, for instance, in the following manner that ammonia gas is supplied at a flow rate of about 350 sccm in a treatment vessel kept under a pressure of about 266 Pa (2 Torr) and at a substrate temperature of about 400° C., and a high frequency of about 13.56 MHz is applied to the semiconductor substrate 61 at about 100 W power or a high frequency of about 350 kHz is applied to a counter electrode at about 55 W power, for about 60 second respectively, using a parallel plate type plasma treatment apparatus having the counter electrode placing away about 9 mm (350 mils) from the semiconductor substrate 61.

Figure 5D:
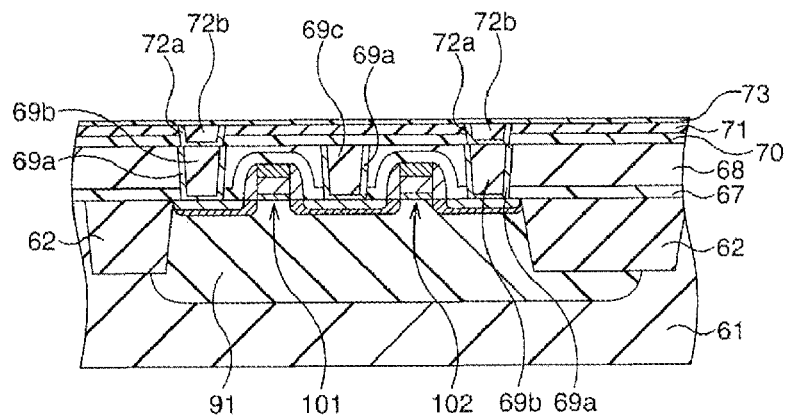

Next, as shown in FIG. 5D, a titanium nitride (TiN) film 73 is formed above the interlayer insulating film 71 and the tungsten (W) plug 72b.

Concretely, first, a titanium (Ti) film is formed above the whole surface by sputtering to supply DC power of about 2.6 kW at the substrate temperature of about 20° C. for about 7 seconds in an argon (Ar) atmosphere at a pressure of about 0.15 Pa, using a sputtering apparatus setting the distance between the semiconductor substrate 61 and the target, for instance, at about 60 mm. Since this titanium (Ti) film is formed above the ammonia-plasma treated interlayer insulating film 71, its titanium (Ti) atom can freely move on the surface of the interlayer insulating film 71 without being caught by an oxygen atom of the interlayer insulating film 71, and as a result, it becomes a self-organized titanium (Ti) film, of which crystal plane is oriented to (002) plane. Then, by conducting the RTA treatment at about 650° C. for about 60 seconds under a nitrogen atmosphere, the titanium nitride (TiN) film 73 is formed. Here, the crystal plane of the titanium nitride (TiN) film 73 orients to (111) plane.

Figure 5E:
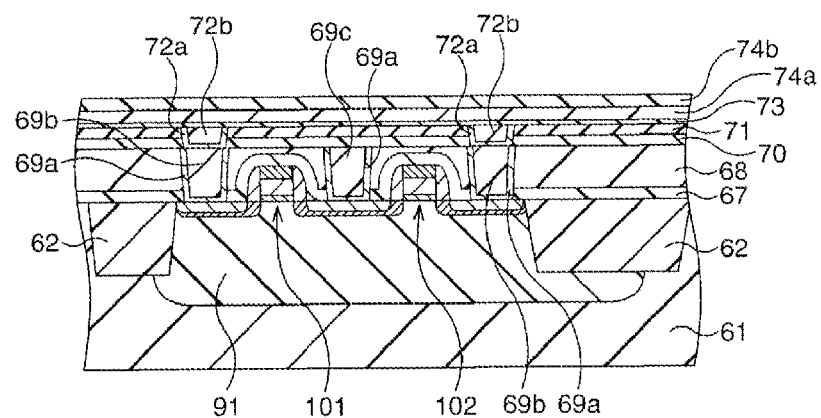

Next, as shown in FIG. 5E, a titanium aluminum nitride (TiAlN) film 74a of about 100 nm in thickness is formed by a reactive sputtering method using a target made by alloying titanium (Ti) and aluminum (Al) on the titanium nitride (TiN) film 73. The titanium aluminum nitride (TiAlN) film 74a is formed by, for instance, a sputtering method in a mixed atmosphere of argon (Ar) at the flow rate of about 40 sccm and nitrogen at the flow rate of about 10 sccm, under the following conditions, about 253.3 Pa, a substrate temperature about 400° C., and an electric power about 1.0 kW. The titanium aluminum nitride (TiAlN) film 74a serves as a lower layer film of the lower electrode. Then, above the titanium aluminum nitride (TiAlN) film 74a, an iridium (Ir) film 74b of about 100 nm in thickness is formed by, for instance, a sputtering method in an argon (Ar) atmosphere under conditions of a pressure about 0.11 Pa, a substrate temperature about 500° C., and an electric power about 0.5 kW. This iridium (Ir) film 74b serves as an upper layer film of the lower electrode. It should be noted that it is possible to use metal such as platinum (Pt) or a conductive oxide such as platinum oxide (PtO), iridium oxide ($IrO_x$) and strontium ruthenium oxide ($StRuO_3$) instead of the iridium (Ir) film 74b. Furthermore, a stacked film of metal or metal oxide can be used as a film forming the lower electrode.

Figure 5F:
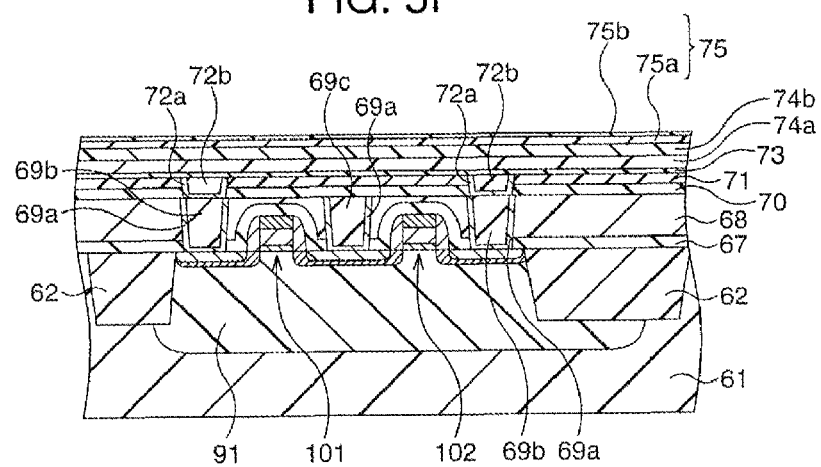

Next, as shown in FIG. 5F, a ferroelectric film 75A which will be a capacitor film is formed above the iridium (Ir) film 74b by the MO-CVD method. Concretely, the ferroelectric film 75A of the present embodiment is formed from a PZT film having a two layered structure (a first PZT film 75a and a second PZT film 75b).

More concretely, first, $Pb(DPM)_2$, $Zr(dmhd)_4$ and $Ti(O-ior)_2(DPM)_2$ are respectively dissolved in a tetrahydrofuran (THF:$C_4H_8O$) solvent at a concentration of about 0.3 mol/l to form respective liquid raw materials of lead (Pb), zirconium (Zr) and titanium (Ti). Then, these liquid raw materials are supplied to the vaporizer of the MO-CVD apparatus at a flow rate of about 0.326 ml/m., about 0.200 ml/m. and about 0.200 ml/m., respectively together with the THF solvent at a flow rate of about 0.474 ml/m. so as to vaporize them to form raw material gases for lead (Pb), zirconium (Zr) and titanium (Ti). Then, in the MO-CVD apparatus, by supplying the raw material gases of lead (Pb), zirconium (Zr) and titanium (Ti) for about 620 seconds under a pressure of about 665 Pa (5 Torr) and a substrate temperature of about 620° C., the first PZT film 75a of about 100 nm in thickness is formed above the iridium (Ir) film 74b.

It is preferable to conduct heat treatment for about 60 seconds at 600° C. to 620° C. in an atmosphere containing oxygen. By this heat treatment, adsorbed impurities existing on the surface of the first PZT film 75a are eradicated. It is possible to enhance capacitor characteristics more in this way.

Then, by applying the sputtering method to the whole surface, an amorphous second PZT film 75b of about 1 nm to 30 nm in thickness, about 20 nm in the present embodiment. When forming the second PZT film 75b by the MO-CVD method, a material prepared by dissolving $Pb(DPM)_2$($Pb(C_{11}H_{19}O_2)_2$) in the THF liquid as an organic source for supplying lead (Pb) is used. As an organic source for supplying zirconium (Zr), a material dissolving Zr $(DMHD)_4$($Zr((C_9H_{15}O_2)_4$) in the THF liquid is used. As an organic source for supplying titanium (Ti), a material prepared by dissolving $Ti(O-iPr)_2(DPM)_2$($Ti((C_3H_7O)_2(C_{11}H_{19}O_2)_2$) in the THF liquid is used.

It should be noted that although in the present embodiment, formation of the ferroelectric film 75A is conducted by the MO-CVD method and the sputtering method, it is not limited to those, but it is possible to form it by, for instance, the sol-gel method, the organic metal decomposition method, the CSD method, the chemical-vapor deposition method or the epitaxial growth method.

Figure 5G:
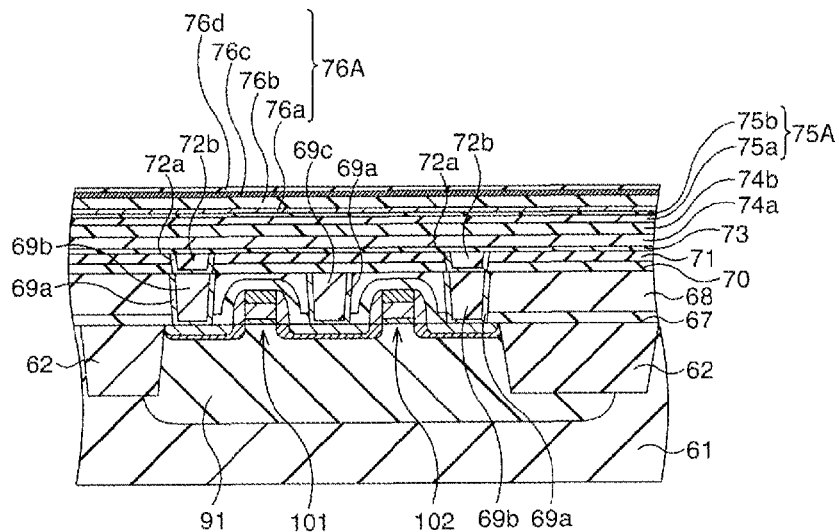

Next, as shown in FIG. 5G, an upper electrode film 76A is formed above the ferroelectric film 75A.

The upper electrode film 76A includes a first conductive oxidation layer 76a made of an oxide of which stoichiometric composition is expressed by a chemical formula $M_1O_{x1}$ using a composition parameter $x_1$, and its practical composition is expressed by a chemical formula $M_1O_{x2}$ using a composition parameter $x_2$, a second conductive oxidation layer 76b formed above the first conductive oxidation layer 76a and made of an oxide of which stoichiometric composition is expressed by a chemical formula $M_2O_{y1}$ using a composition parameter $y_1$, and its practical composition is expressed by a chemical formula $M_2O_{y2}$ using a composition parameter $y_2$, and a third conductive oxidation layer 76c formed above the second conductive oxidation layer 76b and made of an oxide of which stoichiometric composition is expressed by a chemical formula $M_3O_{z1}$ using a composition parameter $z_1$, and its practical composition is expressed by a chemical formula $M_3O_{z2}$ using a composition parameter $z_2$. Here, the second conductive oxidation layer 76b has a degree of oxidation higher than those of the first and the third conductive oxidation layers 76a and 76c, and the composition parameters $x_1$, $x_2$, $y_1$, $y_2$, $z_1$ and $z_2$ have the following relations therebetween, $y_2/y_1 > x_2/x_1$, $y_2/y_1 > z_2/z_1$, and $z_2/z_1 \geq x_2/x_1$. In the present embodiment, the case that all of $M_1$, $M_2$ and $M_3$ is taken as iridium (Ir), and, for instance, $x_2$ is about 1.9, $y_2$ is about 2.1 and $z_2$ is about 2.0, will be instantiated (note that these values are results of the HRBS analysis). In this case, $x_1$, $y_1$ and $z_1$=2. Hereinafter, $x_2$, $y_2$ and $z_2$ are described as x, y and z respectively, for the convenience' sake in description.

When forming the upper electrode film 76A, first, the first conductive oxidation layer 76a is formed above the ferroelectric film 75A.

An iridium oxide (IrOx) film, which is formed by crystallization at the time of deposition, is deposited above the ferroelectric film 75A in film thickness of 20 nm to 70 nm, for instance, about 25 nm, by, for instance, the sputtering method to form the first conductive oxidation layer 76a. For instance, the deposition temperature at this time is set at 300° C., argon (Ar) gas and oxygen ($O_2$) are used as the deposition gas, and the flow rate of the deposition gases is set to be 140 sccm for argon (Ar) and 60 sccm for oxygen ($O_2$). The sputtering power is about 1 kW.

Then, in an atmosphere containing argon (Ar) and oxygen ($O_2$) (for instance argon (Ar): 2000 sccm, $O_2$: 20 sccm), RTA is conducted, for instance, at 725° C. and for 60 seconds. By this heat treatment, the ferroelectric film 75A is completely crystallized, and the plasma damage which the first conductive oxidation layer 76a received at the time of deposition can be repaired, and oxygen loss from the ferroelectric film 75A is replaced.

Then, the second conductive oxidation layer 76b is formed above the first conductive oxidation layer 76a.

An iridium oxide ($IrO_y$) film is deposited of a thickness of 100 nm to 150 nm above the first conductive oxidation layer 76a by, for instance, the sputtering method to form the second conductive oxidation layer 76b. At this time, the deposition temperature is set within the range 30° C. to 100° C., more preferably within the range 50° C. to 75° C., so that the iridium oxide ($IrO_y$) is maintained in a microcrystalline state at the time of deposition. Argon (Ar) and oxygen ($O_2$) are used as the deposition gas, and the flow rate of the gases is controlled at, for instance, 100 sccm of argon (Ar), and 100 sccm of oxygen ($O_2$) so that the content of oxygen ($O_2$) in the gas is higher than that of the first conductive oxidation layer 76a (so that the degree of oxidation is higher than that at the time of forming the first conductive oxidation layer 76a). The sputtering power is adjusted to, for instance, about 1 kW. At this time, no abnormal oxidation occurs in the second conductive oxidation layer 76b, and the iridium oxide ($IrO_y$) having a composition in a uniform microcrystalline state is obtained.

At this time, it is preferable to form iridium oxide ($IrO_y$) of the second conductive oxidation layer 76b so as to have a composition close to the stoichiometric composition of iridium oxide ($IrO_2$). By this formation, no catalytic function to hydrogen is created, and a problem that the ferroelectric film 75A is reduced by a hydrogen radical is suppressed so that the hydrogen resistance of the ferroelectric capacitor structure is improved.

Then, in an atmosphere containing argon (Ar) and oxygen ($O_2$) (for instance argon (Ar): 2000 sccm, $O_2$: sccm), RTA is conducted, for instance, at 700° C. and for 60 seconds. By this heat treatment, it is possible that the adherence among the ferroelectric film 75A, the first conductive oxidation layer 76a and the second conductive oxidation layer 76b is improved, the crystallinity of the second conductive oxidation layer 76b is more stabilized, and defects such as oxygen loss or the like can be reduced.

Then, the third conductive oxidation layer 76c is formed above the second conductive oxidation layer 76b.

The iridium oxide ($IrO_2$) film is deposited above the second conductive oxidation layer 76b in a thickness of 20 nm to 100 nm by, for instance, the sputtering method to form the third conductive oxidation layer 76c. At this time, the deposition temperature is set at 150° c. to 500° C., for instance, 300° C., so that the iridium oxide ($IrO_z$) is crystallized at the time of deposition. Argon (Ar) and oxygen ($O_2$) are used as the deposition gas, and the flow rate of the deposition gas is controlled at, for instance, 140 sccm of argon (Ar), and 60 sccm of oxygen ($O_2$) so that the content of oxygen ($O_2$) in the deposition gas is lower than that of the second conductive oxidation layer 76b (so that the degree of oxidation is lower than that at the time of forming the second conductive oxidation layer 76b). The sputtering power is adjusted to, for instance, about 1 kW to 2 kW. At this time, no abnormal oxidation occurs in the third conductive oxidation layer 76c, and iridium oxide ($IrO_z$) having a composition in a uniform crystalline state is formed.

Next, a fourth layer 76d made of noble metal, for instance, iridium (Ir), ruthenium (Ru) or the like, or an alloy containing such noble metals and of about 50 nm to 150 nm in thickness may be formed above the third conductive oxidation layer 76c. Owing to the fourth layer 76d, the etching damages produced during wiring at the time of formation of the upper electrode 76 to be described later are reduced. When iridium (Ir) is used as the noble metal, for instance, the deposition temperature is set at 400° C., it is formed from a deposition gas having a flow rate of argon (Ar): 199 sccm by the sputtering method.

As above, the upper electrode film 76A composed of the first conductive oxidation layer 76a, the second conductive oxidation layer 76b, the third conductive oxidation layer 76c and the fourth layer 76d stacked in turn is formed above the ferroelectric film 75A.

In the present embodiment, although the example of forming the first conductive oxidation layer 76a, the second conductive oxidation layer 76b and the third conductive oxidation layer 76c composing the upper electrode film 76A with iridium oxide is shown, the present invention is not limited to this, it is also possible to apply a film made of at least one kind of oxide selected from, for instance, the group consisting of platinum oxide, ruthenium oxide, strontium ruthenium oxide, rhodium oxide, rhenium oxide, osmium oxide and palladium oxide to the respective layers 76a to 76c. In this case, a form of conducting sputtering using a target containing at least one kind of noble metal element selected from the group consisting of platinum (Pt), ruthenium (Ru) strontium (Sr) and ruthenium, rhodium (Rh), rhenium (Re), osmium (Os) and palladium (Pd) under conditions of occurring oxidation of the noble metal element is taken.

In this case, there could be various combinations such as, the metal element $M_1$ of the first conductive oxidation layer 76a and the metal element $M_2$ of the second conductive oxidation layer 76b may be made different from each other, the metal element $M_1$ of the first conductive oxidation layer 76a and the metal element $M_3$ of the third conductive oxidation layer 76c may be made differently from each other, or two types of the respective metal elements in the first to third conductive oxidation layers 76a to 76c may be the same, and the remaining one may be different from the others.

Figure 5H:
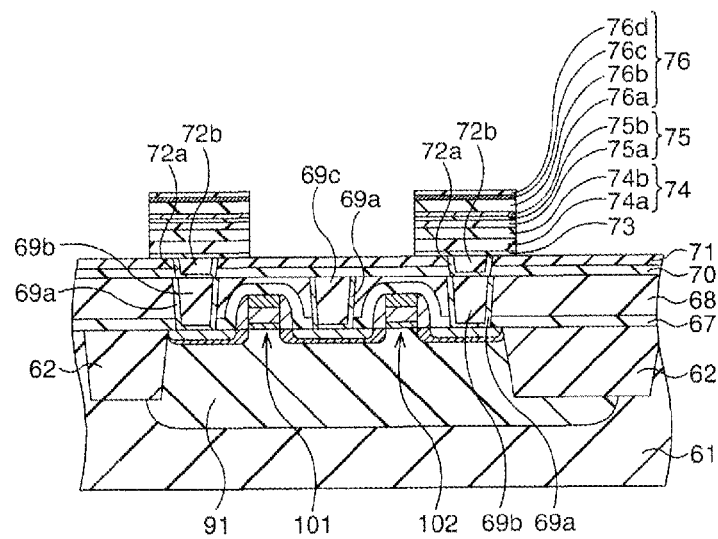

Then, as shown in FIG. 5H, after conducting back cleaning of the semiconductor substrate 61, a hard mask (not shown) covering only a ferroelectric capacitor formation area is formed above the fourth film 76d. Here, as the hard mask, a titanium nitride film of about 200 nm in thickness at a temperature of about 200° C., and a silicon oxide film using TEOS of about 390 nm in thickness at a temperature of about 390° C. are formed in order to form the hard mask by patterning these films.

Then, by conducting etching using the hard mask, the upper electrode film 76A, the ferroelectric film 75A, the iridium (Ir) film 74b, the titanium aluminum nitride (TiAlN) film 74a and the titanium nitride (TiN) film 73 in the area excepting the ferroelectric capacitor formation area are eliminated. Thereby, a ferroelectric capacitor structure is formed in the ferroelectric capacitor formation area, which is provided with the lower electrode 74 composed of the titanium aluminum nitride (TiAlN) film 74a and the iridium (Ir) film 74b, the ferroelectric film 75 composed of the first PZT film 75a and the second PZT film 75b and the upper electrode 76 composed of the first conductive oxidation layer 76a, the second conductive oxidation layer 76b, the third conductive oxidation layer 76c and the fourth layer 76d. Then, after elimination of the hard mask, heat treatment, for instance, at 300° C. to 500° C., for 30 min. to 120 min. is conducted.

Figure 5I:
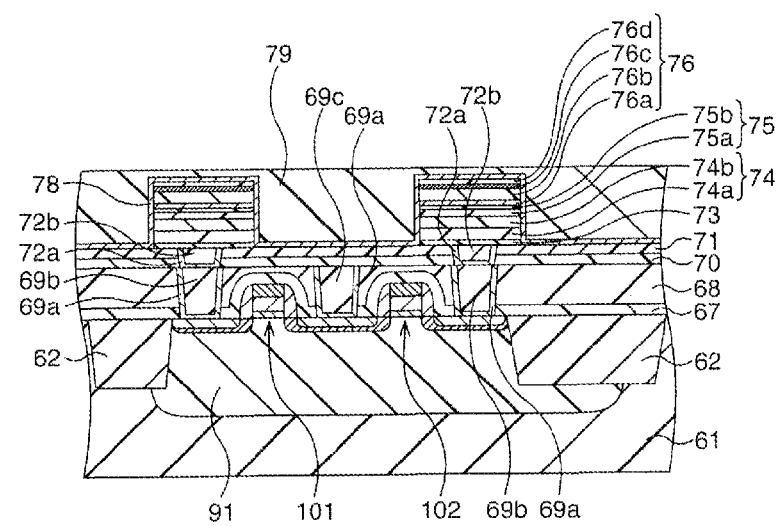

Then, as shown in FIG. 5I, an aluminum oxide ($Al_2O_3$) film 78 is formed to cover the ferroelectric capacitor structure and the interlayer insulating film 71, and at the same time, an interlayer insulating film 79 is formed above the aluminum oxide ($Al_2O_3$) film 78.

Concretely, first, after depositing the aluminum oxide ($Al_2O_3$) film of about 20 nm in thickness by the sputtering method, repair of oxygen loss occurring when the ferroelectric capacitor is created by conducting heat treatment at 600° C. in an oxygen atmosphere. Then, the aluminum oxide ($Al_2O_3$) film 78 is formed by deposition of the aluminum oxide ($Al_2O_3$) film of about 20 nm in thickness using the CVD method. It is also possible here to form an aluminum oxide ($Al_2O_3$) film of about 2 nm in thickness by the ALD method instead of the aluminum oxide ($Al_2O_3$) film 78.

Then, for the purpose of repairing damage to the ferroelectric film 75, recovery annealing is performed on the ferroelectric film 75 in an atmosphere containing oxygen. Although there is no specific limitation for the conditions of the recovery annealing, the present embodiment takes the substrate temperature within the range of 550° C. to 700° C. When the ferroelectric film 75 is a PZT film, it is preferable to conduct the annealing in an oxygen atmosphere at 600° C. for 60 minutes. It is also possible to form an aluminum oxide ($Al_2O_3$) film (not shown) so as to cover the aluminum oxide ($Al_2O_3$) film 78 with a thickness of, for instance, about 40 nm by the CVD method.

Then, a silicon oxide film of about 1500 nm in thickness is deposited by the CVD method using, for instance, plasma TEOS on the whole surface, and thereafter, the interlayer insulating film 79 is formed by flattening the silicon oxide film by the CMP method. Here, when a silicon oxide film is formed as the interlayer insulating film 79, for instance, TEOS gas or a mixture gas of oxygen gas and helium gas is used as a raw material gas. It should be noted that it is also possible to form, for instance, an inorganic film or the like having insulating properties as the interlayer insulating film 79. Thereafter, heat treatment is conducted in a plasma atmosphere generated by using nitrous oxide ($N_2O$) gas or nitrogen ($N_2$) gas or the like. As a result of this heat treatment, moisture in the interlayer insulating film 79 is eliminated and, at the same time, the film properties of the interlayer insulating film 79 are varied, so that moisture finds difficulty in trying to migrate into the interlayer insulating film 79.

Figure 5J:
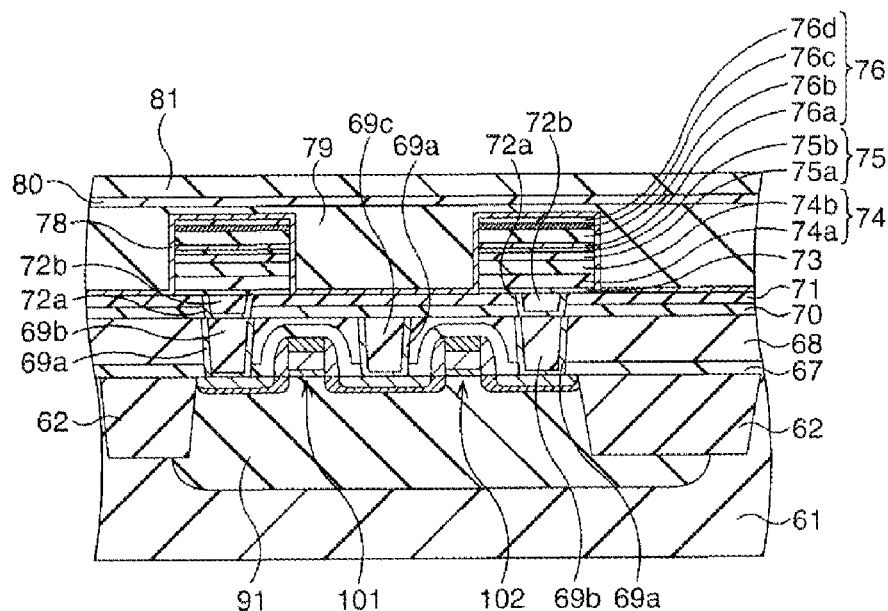

Then, as shown in FIG. 5J, an aluminum oxide ($Al_2O_3$) film 80 of 20 nm to 100 nm in thickness, acting as a barrier film, is formed above the whole surface by, for instance, the sputtering method or the CVD method. Since the aluminum oxide ($Al_2O_3$) film 80 is formed above the flattened interlayer insulating film 79, it is formed flat. Thereafter, a silicon oxide film is deposited above the whole surface by, for instance, the CVD method using a plasma TEOS, and then, the silicon oxide film is flattened by the CMP method to form an interlayer insulating film 81 of 800 nm to 1000 nm in thickness. Note that it is also possible to form a silicon oxynitride (SiON) film, silicon nitride film or the like as the interlayer insulating film 81.

Figure 5K:
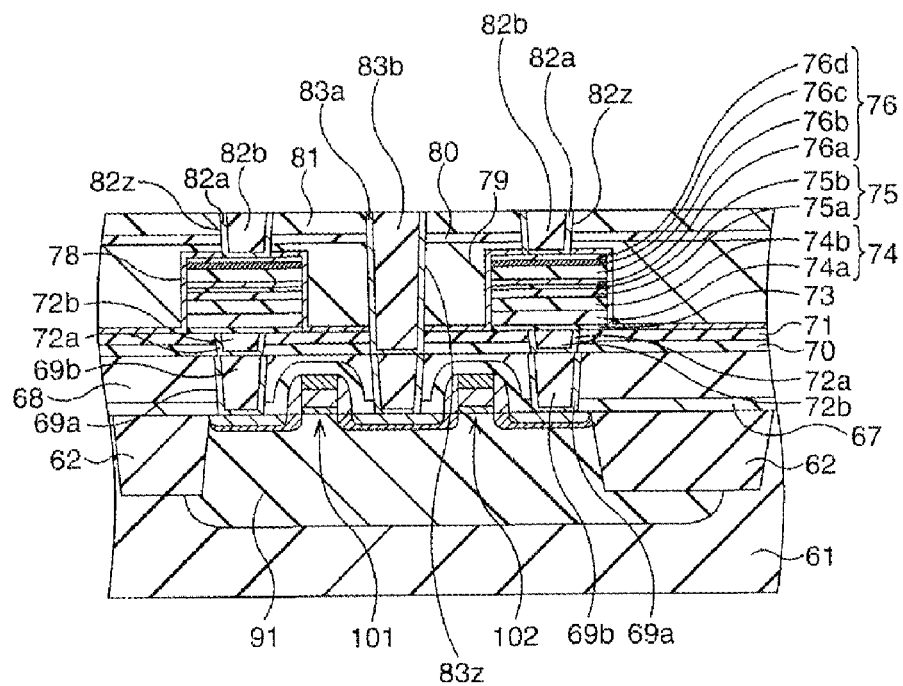

Next, first, after via holes 82z allowing to expose the surface of an iridium (Ir) film 77, which is a hydrogen barrier film in the ferroelectric capacitor, are formed in the interlayer insulating film 81, the aluminum oxide ($Al_2O_3$) film 80, the interlayer insulating film 79 and the aluminum oxide ($Al_2O_3$) film 78, heat treatment is conducted at about 550° C. in an oxygen atmosphere, so that oxygen loss produced in the ferroelectric film 75 when the via holes are formed is repaired. Thereafter, as shown in FIG. 5K, a titanium (Ti) film is deposited in the via hole 82z by, for instance, the sputtering method, and thereafter, titanium nitride (TiN) films are deposited in turn by the MO-CVD method to form a glue film 82a, which is a stacked film of the titanium (Ti) film and the titanium nitride (TiN) film. In this case, since carbon elimination from the titanium nitride (TiN) film is necessary, it requires treatment in a mixture gas plasma of nitrogen and hydrogen. However, since the iridium (Ir) film 77 which functions as a hydrogen barrier film in the ferroelectric capacitor, is formed in the present embodiment, there is no problem of reducing the ferroelectric film 75 by the migration of hydrogen into the ferroelectric film 75.

Then, after deposition of a tungsten (W) film having a thickness sufficient enough to fill inside the via hole 82z by the CVD method, a tungsten (W) plug 82b is formed in the via hole 82z by flattening the tungsten (W) film until the surface of the interlayer insulating film 81 is exposed by the CMP method. Then, after a via hole 83z exposing the surface of the tungsten (W) plug 69c is formed in the interlayer insulating film 81, the aluminum oxide ($Al_2O_3$) film 80, the interlayer insulating film 79, the aluminum oxide ($Al_2O_3$) film 78, the interlayer insulating film 71 and the silicon oxynitride (SiON) film 70, a glue film 83a composed of a TiN (titanium nitride) film is formed in the via hole 83z. It is also possible to form the glue film 83a by depositing a titanium (Ti) film by, for instance, the sputtering method, then depositing a titanium nitride (TiN) film in turn by the MO-CVD method, so that the glue film 83a is formed as that composed of a stacked film of the titanium (Ti) film and the titanium nitride (TiN) film. Then, after depositing a tungsten (W) film having a thickness sufficient enough to fill inside the via hole 83z, a tungsten (W) plug 83b is formed in the via hole 83z by flattening the tungsten (W) film until the surface of the interlayer insulating film 81 is exposed by the CMP method.

Figure 5L:
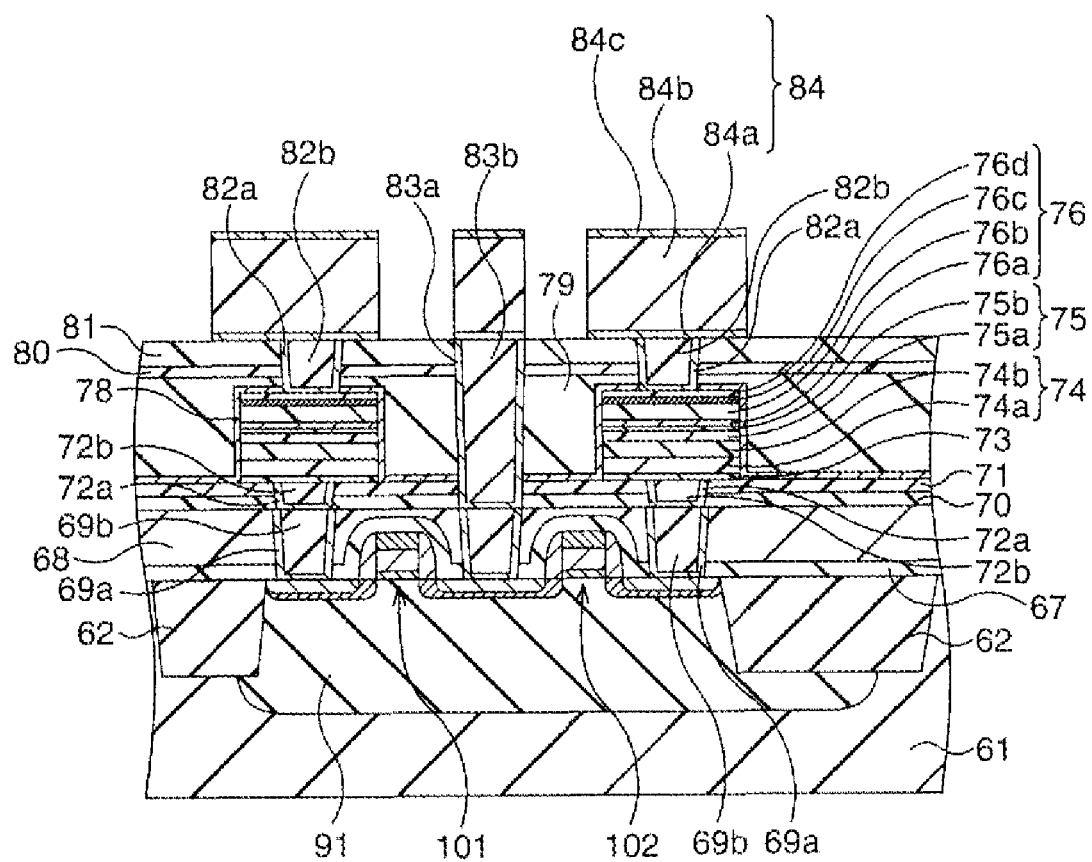

Next, as shown in FIG. 5L, a metal wiring layer 84 is formed.

Concretely, first, a titanium (Ti) film of about 60 nm in thickness, a titanium nitride (TiN) film of about 30 nm in thickness, an aluminum copper (AlCu) alloy film of about 360 nm in thickness, a titanium (Ti) film of about 5 nm in thickness and a titanium nitride (TiN) film of about 70 nm in thickness are stacked in turn. Then, the metal wiring layer 84 composed of a glue film 84a formed from the titanium (Ti) film and the titanium nitride (TiN) film, a wiring film 84b formed from the aluminum copper (AlCu) alloy film, and a glue film 84c formed from the titanium (Ti) film and the titanium nitride (TiN) film is formed above the respective tungsten plugs 82b and 83b by patterning the stacked film in a prescribed shape using the photolithographic technology.

Then, after forming the interlayer insulating film and contact plugs further, metal wiring layers below the second layer are formed, so that a ferroelectric random access memory relating to the present embodiment having a ferroelectric capacitor structure provided with the lower electrode 74, the ferroelectric film 75 and the upper electrode 76 is completed.

The test result of electric characteristics of the ferroelectric capacitor structure in the present embodiment, which is conducted by the present inventor will be explained next.

The respective samples for the upper electrodes are prepared as follows. As for the common conditions for each sample, iridium oxide (IrOx) as the first conductive oxidation layer is formed under the condition that the deposition temperature is 300° C., and oxygen content in the deposition gas is 30% to have the film thickness of about 25 nm, and the heat treatment is conducted under condition of RTA. Iridium oxide (Iroy) as the second conductive oxidation layer is formed under the conditions that the deposition temperature is 60° C., and oxygen content in the deposition gas is 50%, and the heat treatment is conducted under condition of RTA. Iridium oxide (IrOz) as the third conductive oxidation layer is formed at the deposition temperature of 300° C. Iridium (Ir) as the fourth film is formed at about 100 nm in thickness.

The structures of the respective samples (1) to (4) for the upper electrodes are as follows.

Figure 6:
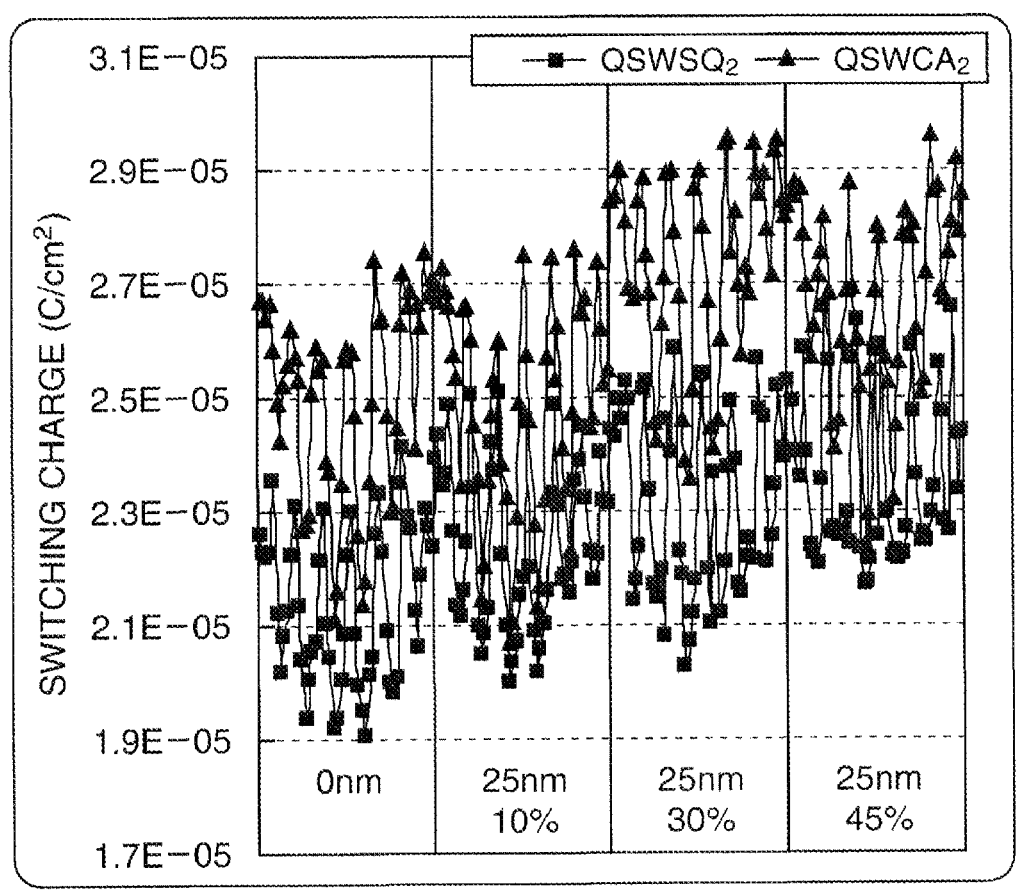
FIG. 6 is a characteristic diagram showing a switching charge of a ferroelectric capacitor structure.

(1) IrOx: film thickness 25 nm/IrOy: film thickness 125 nm/Ir: thickness 100 nm (2) IrOx: film thickness 25 nm/IrOy: film thickness 125 nm/IrOz: film thickness 25 nm ($O_2$: 10%)/Ir: film thickness 100 nm (3) IrOx: film thickness 25 nm/IrOy: film thickness 125 nm/IrOz: film thickness 25 nm ($O_2$: 30%)/Ir: film thickness 100 nm (4) IrOx: film thickness 25 nm/IrOy: film thickness 125 nm/IrOz: film thickness 25 nm ($O_2$: 45%)/Ir: film thickness 100 nm For the respective ferroelectric capacitor structure having the respective samples (1) to (4) as an upper electrode, the electric characteristics of the process out (after forming five layered wiring) are measured. FIG. 6 shows switching charges (reverse charge, applied voltage at 1.8V) of Discrete (when 50 pieces of square ferroelectric capacitor structure of 50 µm×50 µm in plane shape are produced on a silicon substrate in a manner that the ferroelectric capacitor structures are isolated from each other) and Cell Array (when 50 spots of cell areas formed by densely collecting 5152 pieces of the same ferroelectric capacitor structure of 0.7 µm×0.7 µm in size).

By the conventional method (the method described in Patent Document 1), the reverse charge is $2.0 \times 10^{-5}$ C/cm$^2$ or less, and the ferroelectric capacitor structure is significantly deteriorated (not shown). As shown in FIG. 6, there is not so much difference among the case of depositing iridium oxide (IrOz), the case of 10% oxygen content and the case of reverse charge without iridium oxide (IrOz). On the other hand, when the oxygen content are 30% and 45%, the reverse charges of the ferroelectric capacitor structure increase by about 8%.

Figure 7A:
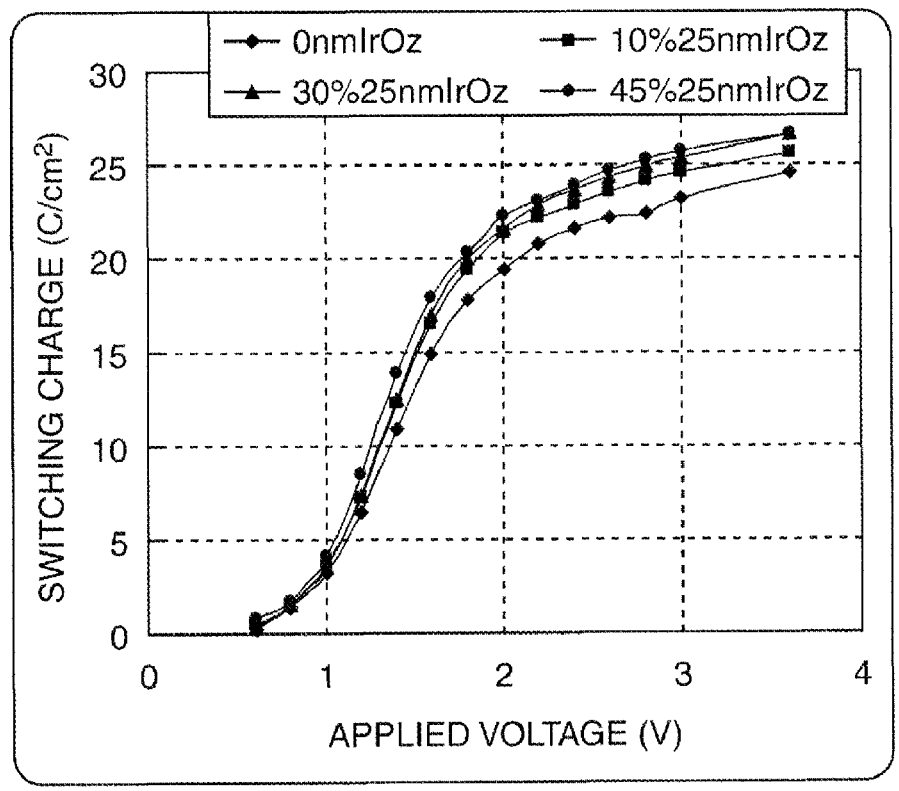
FIGS. 7A and 7B are characteristic diagrams showing the measurement result of a relation between applied voltages and the switching charge Qsw of the ferroelectric capacitor structure.
Figure 7B:
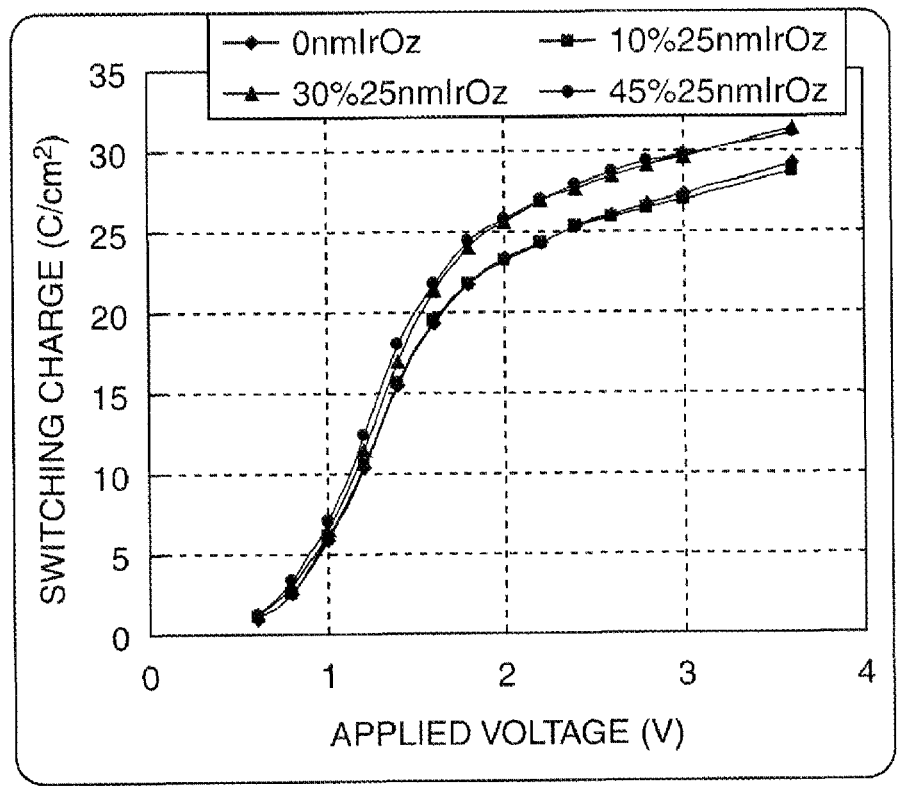

FIG. 7A corresponds to Discrete and FIG. 7B corresponds to Cell Array, and they are characteristic diagrams showing the result of measuring the relation between the applied voltage and the switching charge Qsw of the ferroelectric capacitor structure in the ferroelectric random access memory.

As shown in FIGS. 7A and 7B, as for the sample structure (2), the reverse charge (switching charge Qsw=[(N−U)+(P−D) ½] is a little higher in the case of Discrete than in the case of Cell Array. As for the sample structures (3) and (4), it is understood that in both cases of Discrete and Cell Array, switching charges Qsw higher than those of the sample structure (1) can be obtained over the whole applied voltage range from low voltage to the saturated voltage, and the gradient thereof becomes steep.

In the conventional method (the method described in Patent Document 1), when the deposition temperature of the second conductive oxidation layer is not controlled, the second conductive oxidation layer is amorphous, and holes in film is easily produced by the following heat treatment. These holes are low in hydrogen resistance and water resistance, and deterioration easily occurs during processing. On the contrary, by controlling the deposition temperature of the second conductive oxidation layer to 60° C., uniformly microcrystalline iridium oxide (IrO$_2$) is obtained, and even when crystallized by the following heat treatment, holes in the iridium oxide (IrO$_2$) layer are significantly reduced, and resistance abilities against process deterioration are improved. Furthermore, by depositing the crystallized third conductive oxidation layer above the second conductive oxidation layer, the resistance ability against process deterioration of the ferroelectric capacitor structure is further improved. When oxygen content is 10%, since z in IrOz is low, it is an unstable iridium oxide (IrOz) compound and although holes in film are not created, the barrier-ability against hydrogen migration is reduced. Accordingly, some extent of process deterioration can be found. On the contrary, when oxygen content is 30% or more, IrOz is a stable compound, so holes in film are not created, and hydrogen can be blocked, which results in significant improvement in the resistance ability against process deterioration.

In other words, by depositing the second conductive oxidation layer in a microcrystalline state at a low temperature, a uniform film can be obtained even when conducting heat treatment thereafter. Furthermore, by depositing the third stable crystalline state conductive oxidation layer above the second conductive oxidation layer, hydrogen or moisture migration from the interlayer insulating film above the upper electrode is completely blocked, so that the deterioration of the ferroelectric capacitor structure is suppressed as much as possible.

Figure 8A:
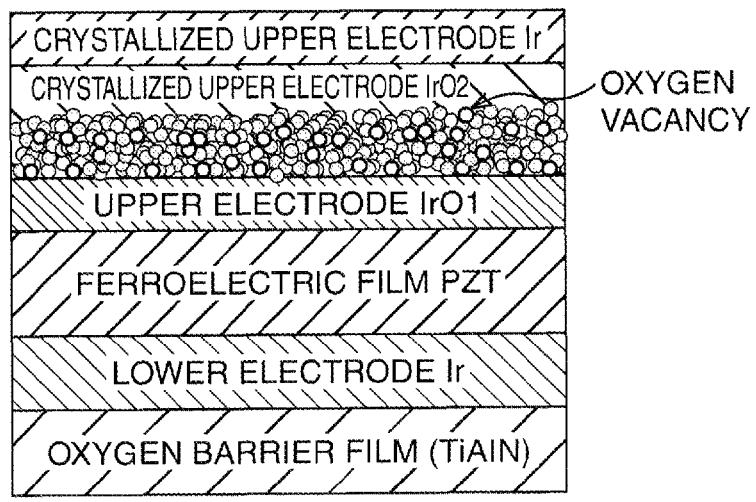
FIGS. 8A, 8B and 8C are sectional views schematically showing the appearance of the ferroelectric capacitor structure according to the method of the present invention and according to the conventional method.
Figure 8B:
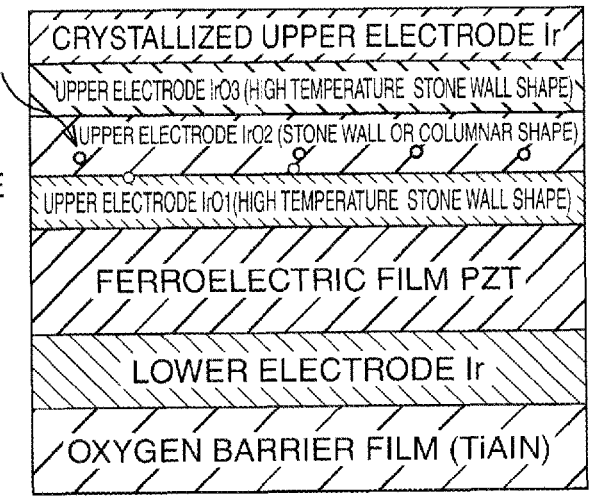
Figure 8C:
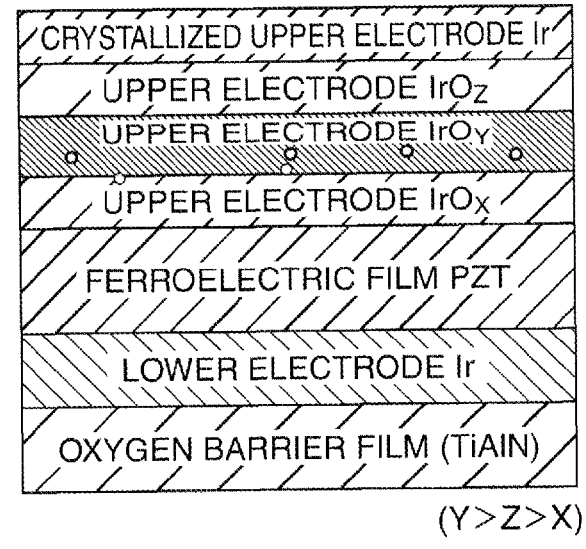

FIG. 8A shows a ferroelectric capacitor structure formed according to the conventional method (the method described in Patent Document 1), and FIGS. 8B and 8C show the ferroelectric capacitor structure according to the present invention respectively. As for the respective layers forming the respective upper electrodes in the drawings in FIGS. 8A, 8B and 8C, they are described as follows for convenience. That is, in FIG. 8A, the upper electrode IrO1, the upper electrode IrO2 and the crystallized upper electrode Ir from the bottom, in FIG. 8B, the upper electrode IrO1, the upper electrode IrO2, the upper electrode IrO3 and the crystallized upper electrode iridium (Ir) from the bottom, in FIG. 8C, the upper electrode IrO$_x$, the upper electrode IrO$_y$, the upper electrode IrO$_z$ and the crystallized upper electrode iridium (Ir) from the bottom, respectively.

In the second conductive oxidation layer in FIG. 8A, since the deposition temperature is not controlled, the lower layer takes on an amorphous state, and the upper layer takes on a columnar structure. After application of a heat treatment, the amorphous lower layer is shirred, and many oxygen vacancies are created. In this case, since the migration path for hydrogen or moisture is short, the ferroelectric film is considered to be easily deteriorated.

On the other hand, since the method according to the present invention described in FIGS. 8B and 8C, controls the deposition temperature of the second conductive oxidation layer, iridium oxide (IrO$_2$) with a stable microcrystalline state is produced. With the application of heat treatment to the second conductive oxidation layer, uniform stone wall shaped or columnar shaped iridium oxide (IrO$_2$) is obtained. Furthermore, the degree of oxidation is lower than that of the second conductive oxidation layer and by forming the third conductive oxidation layer in a crystalline state without generating the hole in film, abnormal growth of crystals in the upper electrode is reduced. By controlling the crystal size, the creation of the hole in film can be reduced to a minimum, and the migration path of hydrogen and moisture is extended. This is considered to be the reason why the ferroelectric film is resistant to deterioration.

From the result described above, in the present embodiment, owing to the first conductive oxidation layer formed above the ferroelectric film, the interface with the ferroelectric film is improved. Further, by forming the microcrystalline second conductive oxidation layer which is higher in its degree of oxidation than that of the first conductive oxidation layer, above the first conductive oxidation layer, creation of holes in film is suppressed. Furthermore, by forming the third conductive oxidation layer in a crystalline state above the second conductive oxidation layer, creation of holes in film is further suppressed. Thereby, process deterioration can be suppressed and abnormal growth in the upper electrode is suppressed, so that a uniformly crystallized upper electrode can be obtained. The ferroelectric capacitor structure is extremely suitable to be applied to a next-generation ferroelectric memory operating at low voltage.

Third Embodiment

A third embodiment of the present invention will be explained next. In the present embodiment, a stacked type ferroelectric random access memory will be disclosed similarly to the second embodiment, but it differs from the second embodiment in such that the structure of the tungsten (W)

plug differs in some respects. In the present embodiment, only the differences from the second embodiment will be explained using a schematic sectional view of the completed ferroelectric random access memory corresponding to FIG. 5L. Note that the same parts as explained in the second embodiment are attached with the same symbols or numerals.

In the second embodiment, as shown in FIG. 5C, when forming the tungsten (W) plug 72b flatly by the CMP method, it is somewhat difficult to flatten the surface of the interlayer insulating film 71 and the surface of the tungsten (W) plug 72b uniformly. In general, the height of the upper surface of the tungsten (W) plug 72b is lower than that of the interlayer insulating film 68, which results in formation of a recess (groove) in the interlayer insulating film 71 around the tungsten (W) plug 72b. The depth of this recess is about 20 nm to 50 nm, typically nearer to the higher end of this range of about 50 nm. This recess affects to no small extent the orientation of the lower electrode 76 and the ferroelectric film 75.

In the present embodiment, considering of solving the above-described problem of the recess formation, a substrate conductive film is formed as follows.

Figure 9:
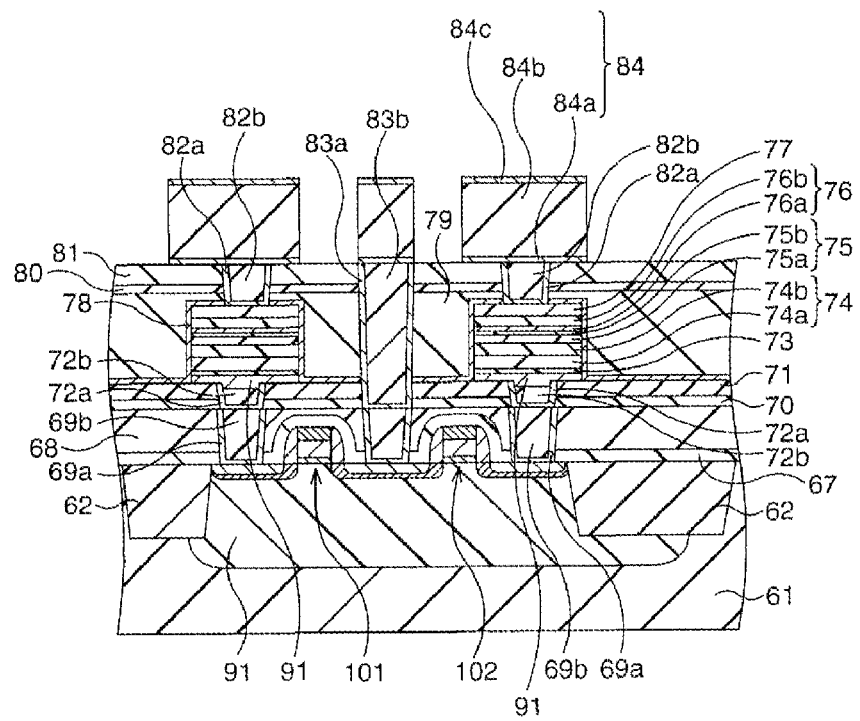
FIG. 9 is a diagrammatic sectional view showing a ferroelectric random access memory manufactured according to a third embodiment.

FIG. 9 shows a schematic sectional view showing the ferroelectric random access memory prepared by the third embodiment.

In the present embodiment, first, the surface of the interlayer insulating film 71 flattened during formation of the tungsten (W) plug 72b by the CMP method is treated by, for instance, ammonia (NH$_3$) plasma. Thereby, the ammonia (NH) group is bonded to the oxygen atoms on the surface of the interlayer insulating film 68. Even if titanium (Ti) atoms are further deposited above the interlayer insulating film 71, the deposited titanium (Ti) atoms would not react with the oxygen atoms, and could freely move on the surface of the interlayer insulating film 71, which results in formation of a titanium (Ti) film on the interlayer insulating film 71, the titanium (Ti) film being self organized in the (002) orientation.

The above-described ammonia (NH$_3$) plasma treatment can be performed using, for instance, a parallel plate type plasma treatment apparatus having a counter electrode at the position about 9 mm (350 mils) away from the semiconductor substrate 61, for example, and ammonia gas is supplied at a flow rate of 350 sccm into a treatment vessel held under a pressure of 266 Pa (2 Torr) at a substrate temperature of 400° C. so as to supply high frequency of 13.56 MHz with a throwing power of 100 W into the side of the substrate to be treated and to supply high frequency of 350 kHz with a throwing power of 55 W into the counter electrode for 60 seconds.

Next, a sputter DC power at 2.6 kW is supplied for 35 seconds at the substrate temperature of 20° C. in an argon (Ar) atmosphere under 0.15 Pa in a sputtering apparatus setting the distance between the semiconductor substrate 61 and the target at, for instance, 60 mm. Thereby, a titanium (Ti) film (100 nm) with a strong titanium (Ti) (002) orientation can be obtained.

Next, RTA heat treatment is conducted for 60 seconds at 650° C. in a nitrogen atmosphere and a substrate conductive film 91 made with a (111) oriented titanium nitride (TiN) covering above the tungsten (W) plug 72b and the interlayer insulating film 71 is formed. The thickness of the substrate conductive film is preferably between about 100 nm and about 300 nm. In the present embodiment, it is about 100 nm. The substrate conductive film 91 is not limited to titanium nitride (TiN), and it is also possible to form any of a tungsten film, a silicon film or a copper film as the substrate conductive film 91.

Here, reflected by the recess formed as described above on the interlayer insulating film 71 around the tungsten (W) plug 72b, a depressed portion is formed on the upper surface of the substrate conductive film 91. However, when such a depressed portion is formed, the crystallinity of the ferroelectric film 75 formed later above the substrate conductive film 91 might be deteriorated.

Then, in the present embodiment, the upper surface of the substrate conductive film 91 is polished and flattened by the CMP method, so that the above-described depressed portion is eliminated. The slurry used in the CMP is not limited especially, but, for instance, SSW2000 made by Cabot Microelectronics Corporation is used in the present embodiment.

Incidentally, the film thickness of the substrate conductive film 91 after CMP fluctuates within the surface of the semiconductor substrate 61 or among plural semiconductor substrates 61 owing to polishing error. Considering such a fluctuation, the target value of the thickness of the substrate conductive film 91 after CMP is set between 50 nm and 100 nm in the present embodiment, more preferably, 50 nm by controlling the time for polishing.

After conducting CMP to the substrate conductive film 91 as above, the crystals near the upper surface of the substrate conductive film 91 are in a distorted state by polishing. However, when the lower electrode 76 in a ferroelectric capacitor structure is formed above the substrate conductive film 91 in which distortion occurs in the crystals thereof as described above, the distortion is taken in the lower electrode 76, which results in deterioration in crystallinity of the lower electrode 76, which leads to a deterioration in the ferroelectric characteristics of the ferroelectric film 75 existing thereabove.

In order to avoid such an inconvenience, the following process is intended not to transfer the distortion of the crystals in the substrate conductive film 91 to the above films by exposing the above-described ammonia (NH$_3$) plasma to the upper surface of the substrate conductive film 91.

Next, a titanium (Ti) film (not shown) is formed as a conductive film for improving crystallinity above the substrate conductive film 91, so that the titanium (Ti) film is nitrided by heat treatment in a nitrogen atmosphere. The following processes are conducted according to the same method as those of the second embodiment. In the etching process of the ferroelectric capacitor structure, the substrate conductive film 91 and the titanium (Ti) film are etched, and the substrate conductive film 91 and the titanium (Ti) film are substantially the same shape as that of the lower electrode 76 or the like. Even by the present embodiment, the same effect as that by the second embodiment can be obtained.

Figure 10:
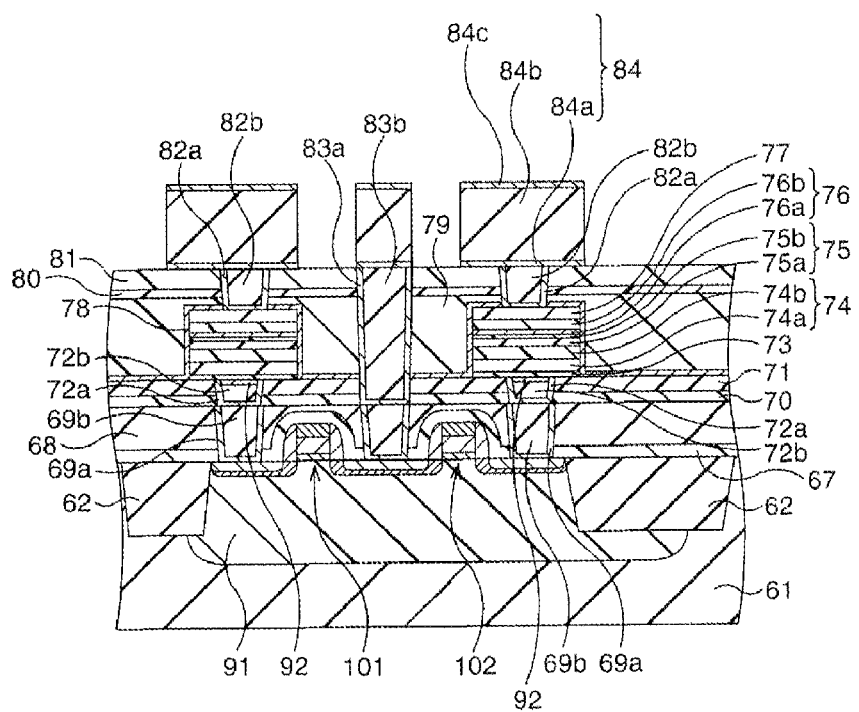
FIG. 10 is a diagrammatic sectional view showing another example of the ferroelectric random access memory manufactured according to the third embodiment.

It should be noted that when the substrate conductive film is processed by the CMP method, it may be polished so as to leave the substrate conductive film only on the tungsten(W) plug 72b, in other words, using, for instance, the interlayer insulating film 71 as a polishing stopper. FIG. 10 shows a device structure in which the substrate conductive film is in this state. Here, a numeral 92 is attached to the substrate conductive film.

Fourth Embodiment

Next, the fourth embodiment of the present invention will be explained. In the present embodiment, a stacked type ferroelectric random access memory will be disclosed similarly to the second embodiment, but it differs from the second embodiment in such that the structure of the tungsten (W) plug differs in some respects. In the present embodiment, only the differences from the second embodiment will be explained using a schematic sectional view of the completed ferroelectric random access memory corresponding to FIG. 5L. Note that the same parts as those structural parts explained in the second embodiment are attached with the same symbols or numerals.

In the second embodiment, in FIG. 5K, a case that the tungsten (W) plug 83b is formed so as to be electrically connected to the tungsten (W) plug 69c, that is, a case of adopting the so-called via-to-via structure is explained as an example, but in this embodiment, one tungsten (W) plug is formed instead of the tungsten (W) plug 69c and the tungsten (W) plug 83b.

Figure 11:
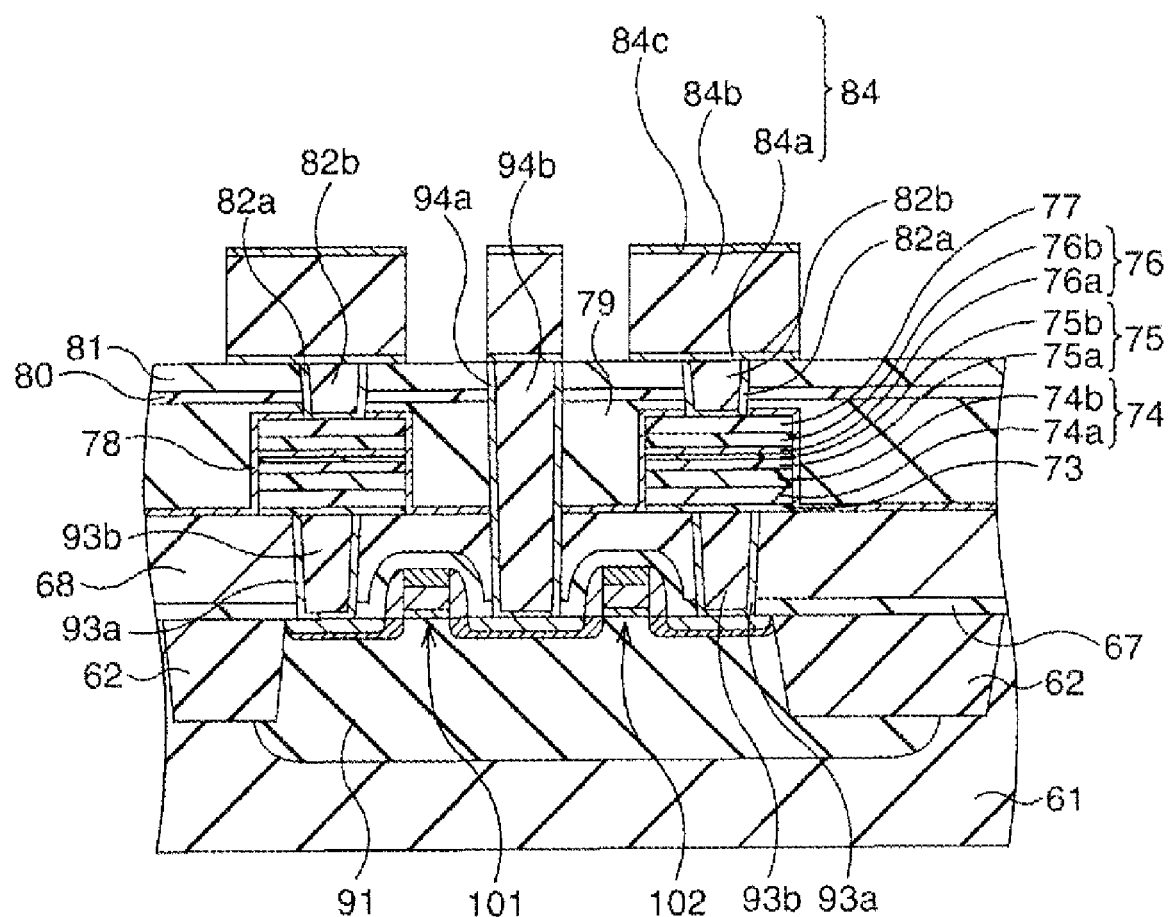
FIG. 11 is a diagrammatic sectional view showing a ferroelectric random access memory manufactured according to a fourth embodiment.

In the present embodiment, as shown in FIG. 11, in the process of forming a tungsten (W) plug in the interlayer insulating film 68, only a glue film 93a and a tungsten (W) plug 93b are formed without forming the tungsten (W) plug 69c, and further, without forming the silicon oxynitride (SiON) film 70, the interlayer insulating film 71, the glue film 72a, the tungsten (W) plug 72b and the like. Then, in the process of forming a tungsten (W) plug in the interlayer insulating film 81 or the like, a contact hole exposing a part of the surface of a high concentration diffusion layer 93 is formed in the interlayer insulating film 81, the aluminum oxide ($Al_2O_3$) film 80, the interlayer insulating film 79, the aluminum oxide ($Al_2O_3$) film 78, the interlayer insulating film 68 and the silicon oxynitride (SiON) film 67, and a glue film 94a and a tungsten (W) plug 94b embedding the contact hole are formed by the CVD method and the CMP method.

Note that even by the present embodiment, the same effect as that of the second embodiment can be obtained.

According to the present invention, by forming an upper electrode of which the crystalline state is controlled, it becomes possible to reduce the creation of holes in film, to prevent migration of hydrogen or the like into, especially, the capacitor film in a multilayer wiring process, so that deterioration of the characteristics of the capacitor film can be reduced to realize improvement in the switching characteristics, the initial characteristics, and the retention characteristics of the device.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
a semiconductor substrate; and
a capacitor structure formed over said semiconductor substrate and structured by the capacitor film being sandwiched between an upper electrode and a lower electrode,
wherein said upper electrode, comprising:
a first layer made of an oxide, of which stoichiometric composition is expressed by a chemical formula $M_1O_{x1}$ using a composition parameter $x_1$, and of which practical composition is expressed by a chemical formula $M_1O_{x2}$ using a composition parameter $x_2$;
a second layer made of an oxide formed on said first layer, and its stoichiometric composition is expressed by a chemical formula $M_2O_{y1}$ using a composition parameter $y_1$, and its practical composition is expressed by a chemical formula $M_2O_{y2}$ using a composition parameter $y_2$; and
a third layer made of an oxide formed on said second layer, and its stoichiometric composition is expressed by a chemical formula $M_3O_{z1}$ using a composition parameter $z_1$, and its practical composition is expressed by a chemical formula $M_3O_{z2}$ using a composition parameter $z_2$,
where the symbols $M_1$, $M_2$ and $M_3$ are respectively expressed as one or plural metal elements,
wherein said second layer has a degree of oxidation higher than said first layer and said third layer; and
wherein said composition parameters $x_1$, $x_2$, $y_1$, $y_2$, $z_1$ and $z_2$ have the following relations therebetween, $$y_2/y_1 > x_2/x_1,\ y_2/y_1 > z_2/z_1,\ \text{and}\ z_2/z_1 \geq x_2/x_1.$$

2. The semiconductor device according to claim 1, wherein said metal element $M_1$ of said first layer and said metal element $M_2$ of said second layer are the same.

3. The semiconductor device according to claim 1, wherein said metal element $M_1$ of said first layer and said metal element $M_2$ of said second layer differ from each other.

4. The semiconductor device according to claim 1, wherein said metal element $M_1$ of said first layer and said metal element $M_3$ of said third layer are the same.

5. The semiconductor device according to claim 1, wherein said metal element $M_1$ of said first layer and said metal element $M_3$ of said third layer differ from each other.

6. The semiconductor device according to claim 1, wherein said metal element $M_1$ of said first layer, said metal element $M_2$ of said second layer and said metal element $M_3$ of said third layer differ from each other.

7. The semiconductor device according to claim 1, wherein said upper electrode further comprises the fourth layer formed above said third layer and made of noble metals or an alloy containing noble metals.

8. The semiconductor device according to claim 1, wherein the thickness of said first layer is thinner than that of said second layer.

9. The semiconductor device according to claim 1, wherein the thickness of said third layer is 50 nm or below, thinner than that of said second layer.

10. The semiconductor device according to claim 1, wherein the crystal size of said first layer is smaller than the crystal size of said second layer.

11. The semiconductor device according to claim 1, wherein the crystal size of said third layer is smaller than the crystal size of said second layer.

12. The semiconductor device according to claim 1, wherein said capacitor film is a ferroelectric film.

13. A method of manufacturing the semiconductor device having a capacitor structure comprising:
forming a lower electrode having said capacitor structure over a semiconductor substrate;
forming a capacitor film over said lower electrode; and
forming an upper electrode over said capacitor film by stacking at least a first conductive oxidation layer, a second conductive oxidation layer and a third conductive oxidation layer sequentially,
wherein forming said first conductive oxidation layer and said third conductive layer is conducted under the oxidation content lower than that in depositing said second conductive oxidation layer.

14. The method of manufacturing the semiconductor device according to claim 13,
wherein said third conductive oxidation layer is crystallized under controlling the temperature of said semiconductor substrate in forming said third conductive oxidation layer.

15. The method of manufacturing the semiconductor device according to claim 13, further comprising:

heat treating said capacitor film at a first temperature in a mixture gas atmosphere of inert gas and oxidation gas after depositing said capacitor film and before depositing said first conductive oxidation layer;

heat treating at a second temperature higher than said first temperature in an atmosphere containing oxygen for crystallizing said capacitor film.

16. The method of manufacturing the semiconductor device according to claim 13, further comprising:

heat treating said capacitor film at a first temperature in a mixture gas atmosphere of inert gas and oxidation gas after depositing said capacitor film and before depositing said first conductive oxidation layer; and heat treating said capacitor film to crystallize it in an atmosphere containing oxygen at a second temperature higher than said first temperature after depositing said first conductive oxidation layer.

17. The method of manufacturing the semiconductor device according to claim 13, further comprising:

heat treating said capacitor film after forming said capacitor film and before depositing said first conductive oxidation layer;

depositing an amorphous upper capacitor film thinner than the capacitor film above said crystallized capacitor film; and heat treating said capacitor film and said upper capacitor film to crystallize them in an atmosphere containing oxygen at a second temperature higher than said first temperature after depositing said first conductive oxidation film.

18. The method of manufacturing the semiconductor device according to claim 13, further comprising:

heat treating said second conductive oxidation layer in an atmosphere containing oxygen at a third temperature after depositing said second conductive oxidation layer.

19. The method of manufacturing the semiconductor device according to claim 13, wherein said second conductive oxidation layer is deposited at a temperature in the range of 50° C. to 75° C.

20. The method of manufacturing the semiconductor device according to claim 13, wherein said capacitor film is a ferroelectric film.

* * * * *